(12) United States Patent
Rajan et al.

(10) Patent No.: US 8,972,673 B2
(45) Date of Patent: Mar. 3, 2015

(54) POWER MANAGEMENT OF MEMORY CIRCUITS BY VIRTUAL MEMORY SIMULATION

(75) Inventors: Suresh Natarajan Rajan, San Jose, CA (US); Michael John Sebastian Smith, Palo Alto, CA (US); David T. Wang, Thousand Oaks, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/620,601

(22) Filed: Sep. 14, 2012

(65) Prior Publication Data

US 2013/0103377 A1    Apr. 25, 2013

Related U.S. Application Data

(63) Continuation of application No. 13/343,612, filed on Jan. 4, 2012, now Pat. No. 8,407,412, which is a continuation of application No. 12/816,756, filed on Jun. 16, 2010, now Pat. No. 8,122,207, which is a (Continued)

(51) Int. Cl.
*G06F 17/50* (2006.01)
*G06F 12/08* (2006.01)
*G11C 11/4093* (2006.01)
*G11C 11/4074* (2006.01)
*G11C 5/14* (2006.01)

(52) U.S. Cl.
CPC ........ *G06F 17/5009* (2013.01); *G11C 11/4093* (2013.01); *G11C 11/4074* (2013.01); *G11C 5/14* (2013.01)
USPC ............... 711/154; 711/167; 711/E12.016; 703/14

(58) Field of Classification Search
CPC ... G06F 17/509; G06F 1/3203; G06F 1/3287; G11C 11/4074; G11C 11/4093; G11C 5/14; G11C 7/12; G11C 7/1048; G11C 11/4091
USPC ............................................ 711/105; 703/14
See application file for complete search history.

(56) References Cited

U.S. PATENT DOCUMENTS 3,800,292 A    3/1974    Curley et al.
4,069,452 A    1/1978    Conway et al.
4,323,965 A    4/1982    Johnson et al.

(Continued)

FOREIGN PATENT DOCUMENTS

DE    102004051345    5/2006    ............. G11C 29/12
DE    102004053316    5/2006    ............... G11C 7/10

(Continued)

OTHER PUBLICATIONS

Final Office Action from U.S. Appl. No. 11/672,924, Dated Feb. 1, 2013.

(Continued)

*Primary Examiner* — Denise Tran
(74) *Attorney, Agent, or Firm* — Fish & Richardson P.C.

(57) ABSTRACT

An apparatus and method are provided for communicating with a plurality of physical memory circuits. In use, at least one virtual memory circuit is simulated where at least one aspect (e.g. power-related aspect, etc.) of such virtual memory circuit(s) is different from at least one aspect of at least one of the physical memory circuits. Further, in various embodiments, such simulation may be carried out by a system (or component thereof), an interface circuit, etc.

14 Claims, 11 Drawing Sheets

Related U.S. Application Data continuation of application No. 11/538,041, filed on Oct. 2, 2006, now abandoned, which is a continuation-in-part of application No. 11/524,811, filed on Sep. 20, 2006, now Pat. No. 7,590,796, which is a continuation-in-part of application No. 11/461,439, filed on Jul. 31, 2006, now Pat. No. 7,580,312.

(56) References Cited

U.S. PATENT DOCUMENTS

| | | |
|---|---|---|
| 4,334,307 A | 6/1982 | Bourgeois et al. |
| 4,345,319 A | 8/1982 | Bernardini et al. |
| 4,392,212 A | 7/1983 | Miyasaka et al. ............ 365/230 |
| 4,500,958 A | 2/1985 | Manton et al. |
| 4,525,921 A | 7/1985 | Carson et al. |
| 4,566,082 A | 1/1986 | Anderson |
| 4,592,019 A | 5/1986 | Huang et al. ................... 365/78 |
| 4,628,407 A | 12/1986 | August et al. |
| 4,646,128 A | 2/1987 | Carson et al. |
| 4,698,748 A | 10/1987 | Juzswik et al. ............... 364/200 |
| 4,706,166 A | 11/1987 | Go |
| 4,710,903 A | 12/1987 | Hereth et al. ................. 365/194 |
| 4,764,846 A | 8/1988 | Go |
| 4,780,843 A | 10/1988 | Tietjen ......................... 364/900 |
| 4,794,597 A | 12/1988 | Ooba et al. |
| 4,796,232 A | 1/1989 | House ........................... 365/189 |
| 4,807,191 A | 2/1989 | Flannagan |
| 4,841,440 A | 6/1989 | Yonezu et al. ................ 364/200 |
| 4,862,347 A | 8/1989 | Rudy |
| 4,884,237 A | 11/1989 | Mueller et al. |
| 4,887,240 A | 12/1989 | Garverick et al. ............ 361/222 |
| 4,888,687 A | 12/1989 | Allison et al. |
| 4,899,107 A | 2/1990 | Corbett et al. ................ 324/158 |
| 4,912,678 A | 3/1990 | Mashiko |
| 4,916,575 A | 4/1990 | Van Asten |
| 4,922,451 A | 5/1990 | Lo et al. |
| 4,935,734 A | 6/1990 | Austin ..................... 340/825.83 |
| 4,937,791 A | 6/1990 | Steele et al. |
| 4,956,694 A | 9/1990 | Eide |
| 4,982,265 A | 1/1991 | Watanabe et al. |
| 4,983,533 A | 1/1991 | Go |
| 5,025,364 A | 6/1991 | Zellmer |
| 5,072,424 A | 12/1991 | Brent et al. ................... 365/189 |
| 5,083,266 A | 1/1992 | Watanabe ..................... 395/275 |
| 5,104,820 A | 4/1992 | Go et al. |
| 5,193,072 A | 3/1993 | Frenkil et al. |
| 5,212,666 A | 5/1993 | Takeda |
| 5,220,672 A | 6/1993 | Nakao et al. .................. 395/750 |
| 5,222,014 A | 6/1993 | Lin |
| 5,241,266 A | 8/1993 | Ahmad et al. ................ 324/158 |
| 5,252,807 A | 10/1993 | Chizinsky .................... 219/390 |
| 5,257,233 A | 10/1993 | Schaefer ....................... 365/227 |
| 5,278,796 A | 1/1994 | Tillinghast et al. ........... 365/211 |
| 5,282,177 A | 1/1994 | McLaury ...................... 365/230 |
| 5,332,922 A | 7/1994 | Oguchi et al. ................ 257/723 |
| 5,347,428 A | 9/1994 | Carson et al. |
| 5,369,749 A | 11/1994 | Baker et al. |
| 5,384,745 A | 1/1995 | Konishi et al. ........... 365/230.03 |
| 5,388,265 A | 2/1995 | Volk .............................. 395/750 |
| 5,390,078 A | 2/1995 | Taylor |
| 5,390,334 A | 2/1995 | Harrison |
| 5,392,251 A | 2/1995 | Manning |
| 5,408,190 A | 4/1995 | Wood et al. .................. 324/765 |
| 5,432,729 A | 7/1995 | Carson et al. |
| 5,448,511 A | 9/1995 | Paurus et al. |
| 5,453,434 A | 9/1995 | Albaugh et al. .............. 514/397 |
| 5,467,455 A | 11/1995 | Gay et al. ..................... 395/281 |
| 5,483,497 A | 1/1996 | Mochizuki et al. |
| 5,498,886 A | 3/1996 | Hsu et al. ..................... 257/713 |
| 5,502,333 A | 3/1996 | Bertin et al. |
| 5,502,667 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. ................... 365/233 |
| 5,530,836 A | 6/1996 | Busch et al. .................. 395/477 |
| 5,550,781 A | 8/1996 | Sugawara et al. |
| 5,559,990 A | 9/1996 | Cheng et al. ................. 395/484 |
| 5,561,622 A | 10/1996 | Bertin et al. |
| 5,563,086 A | 10/1996 | Bertin et al. |
| 5,566,344 A | 10/1996 | Hall et al. ..................... 395/800 |
| 5,581,498 A | 12/1996 | Ludwig et al. |
| 5,581,779 A | 12/1996 | Hall et al. ..................... 395/800 |
| 5,590,071 A | 12/1996 | Kolor et al. ................... 365/149 |
| 5,598,376 A | 1/1997 | Merritt et al. ................. 365/230 |
| 5,604,714 A | 2/1997 | Manning et al. .............. 365/230 |
| 5,606,710 A | 2/1997 | Hall et al. ..................... 395/800 |
| 5,608,262 A | 3/1997 | Degani et al. |
| 5,610,864 A | 3/1997 | Manning ....................... 365/193 |
| 5,623,686 A | 4/1997 | Hall et al. ..................... 395/800 |
| 5,627,791 A | 5/1997 | Wright et al. ................. 365/222 |
| 5,640,337 A | 6/1997 | Huang et al. .................. 364/578 |
| 5,640,364 A | 6/1997 | Merritt et al. ................. 365/233 |
| 5,652,724 A | 7/1997 | Manning ....................... 365/189 |
| 5,654,204 A | 8/1997 | Anderson ....................... 438/15 |
| 5,661,677 A | 8/1997 | Rondeau et al. ................ 365/63 |
| 5,661,695 A | 8/1997 | Zagar et al. ................... 365/233 |
| 5,668,773 A | 9/1997 | Zagar et al. ................... 365/233 |
| 5,675,549 A | 10/1997 | Ong et al. ..................... 365/233 |
| 5,680,342 A | 10/1997 | Frankeny |
| 5,682,354 A | 10/1997 | Manning ....................... 365/233 |
| 5,692,121 A | 11/1997 | Bozso et al. |
| 5,692,202 A | 11/1997 | Kardach et al. .............. 395/750 |
| 5,696,732 A | 12/1997 | Zagar et al. ................... 365/233 |
| 5,696,929 A | 12/1997 | Hasbun et al. |
| 5,702,984 A | 12/1997 | Bertin et al. |
| 5,703,813 A | 12/1997 | Manning et al. .............. 365/189 |
| 5,706,247 A | 1/1998 | Merritt et al. ................. 365/233 |
| RE35,733 E | 2/1998 | Hernandez et al. |
| 5,717,654 A | 2/1998 | Manning ....................... 365/233 |
| 5,721,859 A | 2/1998 | Manning ....................... 397/421 |
| 5,724,288 A | 3/1998 | Cloud et al. .................. 365/193 |
| 5,729,503 A | 3/1998 | Manning ....................... 365/233 |
| 5,729,504 A | 3/1998 | Cowles ......................... 365/236 |
| 5,742,792 A | 4/1998 | Yanai et al. |
| 5,748,914 A | 5/1998 | Barth et al. ................... 395/285 |
| 5,752,045 A | 5/1998 | Chen ............................. 395/750 |
| 5,757,703 A | 5/1998 | Merritt et al. ................. 365/189 |
| 5,760,478 A | 6/1998 | Bozso et al. |
| 5,761,703 A | 6/1998 | Bolyn ............................ 711/106 |
| 5,765,203 A | 6/1998 | Sangha |
| 5,781,766 A | 7/1998 | Davis ............................ 395/552 |
| 5,787,457 A | 7/1998 | Miller et al. |
| 5,798,961 A | 8/1998 | Heyden et al. ................. 365/52 |
| 5,802,010 A | 9/1998 | Zagar et al. ................... 365/233 |
| 5,802,395 A | 9/1998 | Connolly et al. |
| 5,802,555 A | 9/1998 | Shigeeda ....................... 711/106 |
| 5,812,488 A | 9/1998 | Zagar et al. ................... 365/233 |
| 5,818,788 A | 10/1998 | Kimura et al. |
| 5,819,065 A | 10/1998 | Chilton et al. |
| 5,831,833 A | 11/1998 | Shirakawa et al. |
| 5,831,931 A | 11/1998 | Manning ....................... 365/233 |
| 5,831,932 A | 11/1998 | Merritt et al. ................. 365/233 |
| 5,834,838 A | 11/1998 | Anderson ...................... 257/697 |
| 5,835,435 A | 11/1998 | Bogin et al. .................... 365/22 |
| 5,838,165 A | 11/1998 | Chatter |
| 5,838,177 A | 11/1998 | Keeth ............................ 327/108 |
| 5,841,580 A | 11/1998 | Farmwald et al. ............ 365/194 |
| 5,843,799 A | 12/1998 | Hsu et al. ......................... 438/6 |
| 5,843,807 A | 12/1998 | Burns |
| 5,845,108 A | 12/1998 | Yoo et al. ..................... 395/551 |
| 5,850,368 A | 12/1998 | Ong et al. ..................... 365/238 |
| 5,859,792 A | 1/1999 | Rondeau et al. ................ 365/52 |
| 5,860,106 A | 1/1999 | Domen et al. ................ 711/137 |
| 5,870,347 A | 2/1999 | Keeth et al. .................. 365/230 |
| 5,870,350 A | 2/1999 | Bertin et al. |
| 5,872,907 A | 2/1999 | Griess et al. |
| 5,875,142 A | 2/1999 | Chevallier .................... 365/212 |
| 5,878,279 A | 3/1999 | Athenes |
| 5,884,088 A | 3/1999 | Kardach et al. .......... 395/750.06 |
| 5,901,105 A | 5/1999 | Ong et al. ................. 365/230.06 |
| 5,903,500 A | 5/1999 | Tsang et al. .............. 365/189.05 |
| 5,905,688 A | 5/1999 | Park ............................. 365/227 |
| 5,907,512 A | 5/1999 | Parkinson et al. ............ 365/195 |

(56) References Cited

U.S. PATENT DOCUMENTS

| | | | |
|---|---|---|---|
| 5,910,010 A | 6/1999 | Nishizawa et al. | |
| 5,913,072 A | 6/1999 | Wieringa | |
| 5,915,105 A | 6/1999 | Farmwald et al. | 395/309 |
| 5,915,167 A | 6/1999 | Leedy | |
| 5,917,758 A | 6/1999 | Keeth | 365/189.05 |
| 5,923,611 A | 7/1999 | Ryan | 365/233 |
| 5,924,111 A | 7/1999 | Huang et al. | |
| 5,926,435 A | 7/1999 | Park et al. | |
| 5,929,650 A | 7/1999 | Pappert et al. | 324/763 |
| 5,943,254 A | 8/1999 | Bakeman, Jr. et al. | |
| 5,946,265 A | 8/1999 | Cowles | 365/233 |
| 5,949,254 A | 9/1999 | Keeth | 326/87 |
| 5,953,215 A | 9/1999 | Karabatsos | |
| 5,953,263 A | 9/1999 | Farmwald et al. | 365/194 |
| 5,954,804 A | 9/1999 | Farmwald et al. | 710/36 |
| 5,956,233 A | 9/1999 | Yew et al. | |
| 5,960,468 A | 9/1999 | Paluch | |
| 5,962,435 A | 10/1999 | Mao et al. | 514/63 |
| 5,963,429 A | 10/1999 | Chen | |
| 5,963,463 A | 10/1999 | Rondeau et al. | 365/52 |
| 5,963,464 A | 10/1999 | Dell et al. | |
| 5,963,504 A | 10/1999 | Manning | 365/233 |
| 5,966,724 A | 10/1999 | Ryan | 711/105 |
| 5,966,727 A | 10/1999 | Nishino | 711/127 |
| 5,969,996 A | 10/1999 | Muranaka et al. | 65/189.01 |
| 5,973,392 A | 10/1999 | Senba et al. | |
| 5,978,304 A | 11/1999 | Crafts | |
| 5,995,424 A | 11/1999 | Lawrence et al. | |
| 5,995,443 A | 11/1999 | Farmwald et al. | 365/233 |
| 6,001,671 A | 12/1999 | Fjelstad | |
| 6,002,613 A | 12/1999 | Cloud et al. | 365/189 |
| 6,002,627 A | 12/1999 | Chevallier | 365/212 |
| 6,014,339 A | 1/2000 | Kobayashi et al. | 365/233 |
| 6,016,282 A | 1/2000 | Keeth | 365/233 |
| 6,026,027 A | 2/2000 | Terrell, II et al. | |
| 6,026,050 A | 2/2000 | Baker et al. | 365/233 |
| 6,029,250 A | 2/2000 | Keeth | 713/400 |
| 6,032,214 A | 2/2000 | Farmwald et al. | 710/129 |
| 6,032,215 A | 2/2000 | Farmwald et al. | 710/129 |
| 6,034,916 A | 3/2000 | Lee | 365/233 |
| 6,034,918 A | 3/2000 | Farmwald et al. | 365/233 |
| 6,035,365 A | 3/2000 | Farmwald et al. | 710/129 |
| 6,038,195 A | 3/2000 | Farmwald et al. | 365/233 |
| 6,038,673 A | 3/2000 | Benn et al. | 713/323 |
| 6,044,028 A | 3/2000 | Tomohiro et al. | |
| 6,044,032 A | 3/2000 | Li | 365/230 |
| 6,047,073 A | 4/2000 | Norris et al. | |
| 6,047,344 A | 4/2000 | Kawasumi et al. | 710/107 |
| 6,047,361 A | 4/2000 | Ingenio et al. | |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | 327/108 |
| 6,070,217 A | 5/2000 | Connolly et al. | |
| 6,073,223 A | 6/2000 | McAllister et al. | 711/167 |
| 6,075,730 A | 6/2000 | Barth et al. | 365/191 |
| 6,075,744 A | 6/2000 | Tsern et al. | 365/230 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| 6,091,251 A | 7/2000 | Wood et al. | 324/755 |
| RE36,839 E | 8/2000 | Simmons et al. | 326/93 |
| 6,101,152 A | 8/2000 | Farmwald et al. | 365/233 |
| 6,101,564 A | 8/2000 | Athenes et al. | |
| 6,101,612 A | 8/2000 | Jeddeloh | 713/401 |
| 6,108,795 A | 8/2000 | Jeddeloh | 713/401 |
| 6,111,812 A | 8/2000 | Gans et al. | 365/233 |
| 6,125,072 A | 9/2000 | Wu | |
| 6,134,638 A | 10/2000 | Olarig et al. | 711/167 |
| 6,154,370 A | 11/2000 | Degani et al. | |
| 6,166,991 A | 12/2000 | Phelan | 365/233 |
| 6,181,640 B1 | 1/2001 | Kang | |
| 6,182,184 B1 | 1/2001 | Farmwald et al. | 710/129 |
| 6,199,151 B1 | 3/2001 | Williams et al. | |
| 6,208,168 B1 | 3/2001 | Rhee | 326/83 |
| 6,216,246 B1 | 4/2001 | Shau | 714/763 |
| 6,222,739 B1 | 4/2001 | Bhakta et al. | |
| 6,226,709 B1 | 5/2001 | Goodwin et al. | |
| 6,226,730 B1 | 5/2001 | Murdoch et al. | |
| 6,233,192 B1 | 5/2001 | Tanaka | |
| 6,233,650 B1 | 5/2001 | Johnson et al. | |
| 6,240,048 B1 | 5/2001 | Matsubara | 365/233 |
| 6,243,282 B1 | 6/2001 | Rondeau et al. | 365/52 |
| 6,252,807 B1 | 6/2001 | Suzuki et al. | |
| 6,253,278 B1 | 6/2001 | Ryan | |
| 6,260,097 B1 | 7/2001 | Farmwald et al. | 710/129 |
| 6,260,154 B1 | 7/2001 | Jeddeloh | 713/401 |
| 6,262,938 B1 | 7/2001 | Lee et al. | 365/233 |
| 6,266,285 B1 | 7/2001 | Farmwald et al. | 365/194 |
| 6,266,292 B1 | 7/2001 | Tsern et al. | 365/230 |
| 6,274,395 B1 | 8/2001 | Weber | 438/14 |
| 6,279,069 B1 | 8/2001 | Robinson et al. | 711/103 |
| 6,295,572 B1 | 9/2001 | Wu | 710/131 |
| 6,297,966 B1 | 10/2001 | Lee et al. | |
| 6,298,426 B1 | 10/2001 | Ajanovic | 711/172 |
| 6,304,511 B1 | 10/2001 | Gans et al. | 365/233 |
| 6,307,769 B1 | 10/2001 | Nuxoll et al. | 365/63 |
| 6,314,051 B1 | 11/2001 | Farmwald et al. | 365/233 |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | 365/233 |
| 6,326,810 B1 | 12/2001 | Keeth | 326/83 |
| 6,327,664 B1 | 12/2001 | Dell et al. | 713/323 |
| 6,330,683 B1 | 12/2001 | Jeddeloh | 713/401 |
| 6,336,174 B1 | 1/2002 | Li et al. | |
| 6,338,108 B1 | 1/2002 | Motomura | 710/110 |
| 6,338,113 B1 | 1/2002 | Kubo et al. | 711/105 |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | 365/195 |
| 6,356,105 B1 | 3/2002 | Volk | 326/30 |
| 6,356,500 B1 | 3/2002 | Cloud et al. | 365/226 |
| 6,362,656 B2 | 3/2002 | Rhee | 326/87 |
| 6,363,031 B2 | 3/2002 | Phelan | 365/233 |
| 6,378,020 B2 | 4/2002 | Farmwald et al. | 710/129 |
| 6,381,188 B1 | 4/2002 | Choi et al. | 365/222 |
| 6,381,668 B1 | 4/2002 | Lunteren | 711/5 |
| 6,389,514 B1 | 5/2002 | Rokicki | |
| 6,392,304 B1 | 5/2002 | Butler | |
| 6,414,868 B1 | 7/2002 | Wong et al. | 365/51 |
| 6,418,034 B1 | 7/2002 | Weber et al. | |
| 6,421,754 B1 | 7/2002 | Kau et al. | |
| 6,424,532 B2 | 7/2002 | Kawamura | |
| 6,426,916 B2 | 7/2002 | Farmwald et al. | 365/233 |
| 6,429,029 B1 | 8/2002 | Eldridge et al. | 438/14 |
| 6,430,103 B2 | 8/2002 | Nakayama et al. | 365/230.03 |
| 6,434,660 B1 | 8/2002 | Lambert et al. | |
| 6,437,600 B1 | 8/2002 | Keeth | 326/86 |
| 6,438,057 B1 | 8/2002 | Ruckerbauer | 365/222 |
| 6,442,698 B2 | 8/2002 | Nizar | 713/320 |
| 6,445,591 B1 | 9/2002 | Kwong | |
| 6,452,826 B1 | 9/2002 | Kim et al. | |
| 6,452,863 B2 | 9/2002 | Farmwald et al. | 365/233 |
| 6,453,400 B1 | 9/2002 | Maesako et al. | 711/167 |
| 6,453,402 B1 | 9/2002 | Jeddeloh | 711/167 |
| 6,453,434 B2 | 9/2002 | Delp et al. | |
| 6,455,348 B1 | 9/2002 | Yamaguchi | |
| 6,457,095 B1 | 9/2002 | Volk | 711/105 |
| 6,459,651 B1 | 10/2002 | Lee et al. | 365/233 |
| 6,473,831 B1 | 10/2002 | Schade | 711/115 |
| 6,476,476 B1 | 11/2002 | Glenn | |
| 6,480,929 B1 | 11/2002 | Gauthier et al. | 711/105 |
| 6,487,102 B1 | 11/2002 | Halbert et al. | |
| 6,489,669 B2 | 12/2002 | Shimada et al. | |
| 6,490,161 B1 | 12/2002 | Johnson | |
| 6,492,726 B1 | 12/2002 | Quek et al. | |
| 6,493,789 B2 | 12/2002 | Ware et al. | 711/105 |
| 6,496,440 B2 | 12/2002 | Manning | 365/230.03 |
| 6,496,897 B2 | 12/2002 | Ware et al. | 711/105 |
| 6,498,766 B2 | 12/2002 | Lee et al. | 365/233 |
| 6,510,097 B2 | 1/2003 | Fukuyama | 365/230.03 |
| 6,510,503 B2 | 1/2003 | Gillingham et al. | 711/167 |

(56) References Cited

U.S. PATENT DOCUMENTS

| | | | |
|---|---|---|---|
| 6,512,392 B2 | 1/2003 | Fleury et al. ................. 324/765 |
| 6,521,984 B2 | 2/2003 | Matsuura |
| 6,526,471 B1 | 2/2003 | Shimomura et al. ................ 1/5 |
| 6,526,473 B1 | 2/2003 | Kim |
| 6,526,484 B1 | 2/2003 | Stacovsky et al. ............ 711/158 |
| 6,545,895 B1 | 4/2003 | Li et al. |
| 6,546,446 B2 | 4/2003 | Farmwald et al. ............ 710/305 |
| 6,553,450 B1 | 4/2003 | Dodd et al. .................... 711/105 |
| 6,560,158 B2 | 5/2003 | Choi et al. .................... 365/226 |
| 6,563,337 B2 | 5/2003 | Dour ................................ 326/30 |
| 6,563,759 B2 | 5/2003 | Yahata et al. ................. 365/233 |
| 6,564,281 B2 | 5/2003 | Farmwald et al. ............ 710/305 |
| 6,564,285 B1 | 5/2003 | Mills et al. .................... 711/105 |
| 6,574,150 B2 | 6/2003 | Suyama et al. ......... 365/189.05 |
| 6,584,037 B2 | 6/2003 | Farmwald et al. ............ 365/233 |
| 6,587,912 B2 | 7/2003 | Leddige et al. .................... 711/5 |
| 6,590,822 B2 | 7/2003 | Hwang et al. ................. 365/233 |
| 6,594,770 B1 | 7/2003 | Sato et al. ..................... 713/320 |
| 6,597,616 B2 | 7/2003 | Tsern et al. .................... 365/222 |
| 6,597,617 B2 | 7/2003 | Ooishi et al. |
| 6,614,700 B2 | 9/2003 | Dietrich et al. .............. 365/194 |
| 6,618,267 B1 | 9/2003 | Dalal et al. |
| 6,618,791 B1 | 9/2003 | Dodd et al. .................... 711/105 |
| 6,621,760 B1 | 9/2003 | Ahmad et al. ................. 365/233 |
| 6,628,538 B2 | 9/2003 | Funaba et al. |
| 6,629,282 B1 | 9/2003 | Sugamori et al. |
| 6,630,729 B2 | 10/2003 | Huang |
| 6,631,086 B1 | 10/2003 | Bill et al. .................. 365/185.09 |
| 6,639,820 B1 | 10/2003 | Khandekar et al. |
| 6,646,939 B2 | 11/2003 | Kwak |
| 6,650,588 B2 | 11/2003 | Yamagata ..................... 365/222 |
| 6,650,594 B1 | 11/2003 | Lee et al. ....................... 365/233 |
| 6,657,634 B1 | 12/2003 | Sinclair et al. |
| 6,657,918 B2 | 12/2003 | Foss et al. ...................... 365/233 |
| 6,657,919 B2 | 12/2003 | Foss et al. ...................... 365/233 |
| 6,658,016 B1 | 12/2003 | Dai et al. |
| 6,658,530 B1 | 12/2003 | Robertson et al. ............ 711/115 |
| 6,659,512 B1 | 12/2003 | Harper et al. |
| 6,664,625 B2 | 12/2003 | Hiruma |
| 6,665,224 B1 | 12/2003 | Lehmann et al. ............ 365/222 |
| 6,665,227 B2 | 12/2003 | Fetzer .............................. 365/229 |
| 6,668,242 B1 | 12/2003 | Reynov et al. |
| 6,674,154 B2 | 1/2004 | Minamio et al. |
| 6,683,372 B1 | 1/2004 | Wong et al. |
| 6,684,292 B1 | 1/2004 | Piccirillo et al. |
| 6,690,191 B2 | 2/2004 | Wu et al. |
| 6,697,295 B2 | 2/2004 | Farmwald et al. ............ 365/233 |
| 6,701,446 B2 | 3/2004 | Tsern et al. .................... 713/501 |
| 6,705,877 B1 | 3/2004 | Li et al. |
| 6,708,144 B1 | 3/2004 | Merryman et al. ............. 703/14 |
| 6,710,430 B2 | 3/2004 | Minamio et al. |
| 6,711,043 B2 | 3/2004 | Friedman et al. |
| 6,713,856 B2 | 3/2004 | Tsai et al. |
| 6,714,433 B2 | 3/2004 | Doblar et al. |
| 6,714,891 B2 | 3/2004 | Dendinger .................... 702/132 |
| 6,724,684 B2 | 4/2004 | Kim ................................ 365/233 |
| 6,730,540 B2 | 5/2004 | Siniaguine |
| 6,731,009 B1 | 5/2004 | Jones et al. |
| 6,731,527 B2 | 5/2004 | Brown ............................. 365/63 |
| 6,742,098 B1 | 5/2004 | Halbert et al. |
| 6,744,687 B2 | 6/2004 | Koo et al. ..................... 365/226 |
| 6,747,887 B2 | 6/2004 | Halbert et al. |
| 6,751,113 B2 | 6/2004 | Bhakta et al. |
| 6,751,696 B2 | 6/2004 | Farmwald et al. ............ 710/305 |
| 6,754,129 B2 | 6/2004 | Khateri et al. ................. 365/226 |
| 6,754,132 B2 | 6/2004 | Kyung ........................... 365/233 |
| 6,757,751 B1 | 6/2004 | Gene |
| 6,762,948 B2 | 7/2004 | Kyun et al. ..................... 365/51 |
| 6,765,812 B2 | 7/2004 | Anderson |
| 6,766,469 B2 | 7/2004 | Larson et al. |
| 6,771,526 B2 | 8/2004 | LaBerge |
| 6,772,359 B2 | 8/2004 | Kwak et al. |
| 6,779,097 B2 | 8/2004 | Gillingham et al. ........... 711/167 |
| 6,785,767 B2 | 8/2004 | Coulson ........................ 711/112 |
| 6,791,877 B2 | 9/2004 | Miura et al. ................... 365/185 |
| 6,795,899 B2 | 9/2004 | Dodd et al. .................... 711/137 |
| 6,799,241 B2 | 9/2004 | Kahn et al. .................... 711/105 |
| 6,801,989 B2 | 10/2004 | Johnson et al. ............... 711/167 |
| 6,807,598 B2 | 10/2004 | Farmwald et al. ........... 710/305 |
| 6,807,650 B2 | 10/2004 | Lamb et al. |
| 6,807,655 B1 | 10/2004 | Rehani et al. ....................... 716/4 |
| 6,810,475 B1 | 10/2004 | Tardieux |
| 6,816,991 B2 | 11/2004 | Sanghani ...................... 714/733 |
| 6,819,602 B2 | 11/2004 | Seo et al. ....................... 365/193 |
| 6,819,617 B2 | 11/2004 | Hwang et al. ................. 365/222 |
| 6,820,163 B1 | 11/2004 | McCall et al. ................. 710/310 |
| 6,820,169 B2 | 11/2004 | Wilcox et al. ................. 711/105 |
| 6,826,104 B2 | 11/2004 | Kawaguchi et al. .......... 365/222 |
| 6,839,290 B2 | 1/2005 | Ahmad et al. ................. 365/193 |
| 6,844,754 B2 | 1/2005 | Yamagata |
| 6,845,027 B2 | 1/2005 | Mayer et al. |
| 6,845,055 B1 | 1/2005 | Koga et al. .................... 365/229 |
| 6,847,582 B2 | 1/2005 | Pan ................................. 365/233 |
| 6,850,449 B2 | 2/2005 | Takahashi ..................... 365/222 |
| 6,854,043 B2 | 2/2005 | Hargis et al. |
| 6,862,202 B2 | 3/2005 | Schaefer |
| 6,862,249 B2 | 3/2005 | Kyung ........................... 365/233 |
| 6,862,653 B1 | 3/2005 | Dodd et al. .................... 711/105 |
| 6,873,534 B2 | 3/2005 | Bhakta et al. |
| 6,878,570 B2 | 4/2005 | Lyu et al. |
| 6,894,933 B2 | 5/2005 | Kuzmenka et al. ....... 365/189.05 |
| 6,898,683 B2 | 5/2005 | Nakamura .................... 711/167 |
| 6,908,314 B2 | 6/2005 | Brown ............................. 439/68 |
| 6,912,778 B2 | 7/2005 | Ahn et al. ........................ 29/852 |
| 6,914,786 B1 | 7/2005 | Paulsen et al. |
| 6,917,219 B2 | 7/2005 | New ................................ 326/41 |
| 6,922,371 B2 | 7/2005 | Takahashi et al. ............ 365/227 |
| 6,930,900 B2 | 8/2005 | Bhakta et al. |
| 6,930,903 B2 | 8/2005 | Bhakta et al. |
| 6,938,119 B2 | 8/2005 | Kohn et al. .................. 711/1.05 |
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 6,961,281 B2 | 11/2005 | Wong et al. ................ 365/230.03 |
| 6,968,416 B2 | 11/2005 | Moy ................................ 10/310 |
| 6,968,419 B1 | 11/2005 | Holman ........................... 711/5 |
| 6,970,968 B1 | 11/2005 | Holman ........................... 711/5 |
| 6,980,021 B1 | 12/2005 | Srivastava et al. ............. 326/30 |
| 6,986,118 B2 | 1/2006 | Dickman ........................ 716/8 |
| 6,992,501 B2 | 1/2006 | Rapport |
| 6,992,950 B2 | 1/2006 | Foss et al. ...................... 365/233 |
| 7,000,062 B2 | 2/2006 | Perego et al. ..................... 711/5 |
| 7,003,618 B2 | 2/2006 | Perego et al. ..................... 711/5 |
| 7,003,639 B2 | 2/2006 | Tsern et al. .................... 711/154 |
| 7,007,095 B2 | 2/2006 | Chen et al. |
| 7,007,175 B2 | 2/2006 | Chang et al. .................. 713/300 |
| 7,010,642 B2 | 3/2006 | Perego et al. ..................... 711/5 |
| 7,010,736 B1 | 3/2006 | Teh et al. ....................... 714/733 |
| 7,024,518 B2 | 4/2006 | Halbert et al. ................. 711/115 |
| 7,026,708 B2 | 4/2006 | Cady et al. |
| 7,028,215 B2 | 4/2006 | Depew et al. |
| 7,028,234 B2 | 4/2006 | Huckaby et al. .............. 714/710 |
| 7,033,861 B1 | 4/2006 | Partridge et al. |
| 7,035,150 B2 | 4/2006 | Streif et al. .................... 365/194 |
| 7,043,599 B1 | 5/2006 | Ware et al. .................... 711/106 |
| 7,043,611 B2 | 5/2006 | McClannahan et al. |
| 7,045,396 B2 | 5/2006 | Crowley et al. |
| 7,045,901 B2 | 5/2006 | Lin et al. |
| 7,046,538 B2 | 5/2006 | Kinsley et al. |
| 7,053,470 B1 | 5/2006 | Sellers et al. |
| 7,053,478 B2 | 5/2006 | Roper et al. |
| 7,058,776 B2 | 6/2006 | Lee ................................. 711/167 |
| 7,058,863 B2 | 6/2006 | Kouchi et al. ................. 714/718 |
| 7,061,784 B2 | 6/2006 | Jakobs et al. |
| 7,061,823 B2 | 6/2006 | Faue et al. ................. 365/230.08 |
| 7,062,689 B2 * | 6/2006 | Slobodnik ...................... 714/718 |
| 7,066,741 B2 | 6/2006 | Burns et al. |
| 7,075,175 B2 | 7/2006 | Kazi et al. ...................... 257/678 |
| 7,079,396 B2 | 7/2006 | Gates et al. |
| 7,079,441 B1 | 7/2006 | Partsch et al. ................. 365/226 |
| 7,079,446 B2 | 7/2006 | Murtagh et al. ............... 365/233 |
| 7,085,152 B2 | 8/2006 | Ellis et al. ...................... 365/149 |

(56) References Cited

U.S. PATENT DOCUMENTS

| | | |
|---|---|---|
| 7,085,941 B2 | 8/2006 | Li ................................. 713/300 |
| 7,089,438 B2 | 8/2006 | Raad ............................ 713/322 |
| 7,093,101 B2 | 8/2006 | Aasheim et al. ............. 711/207 |
| 7,103,730 B2 | 9/2006 | Saxena et al. ................ 711/156 |
| 7,110,322 B2 | 9/2006 | Farmwald et al. |
| 7,111,143 B2 | 9/2006 | Walker |
| 7,117,309 B2 | 10/2006 | Bearden |
| 7,119,428 B2 | 10/2006 | Tanie et al. |
| 7,120,727 B2 | 10/2006 | Lee et al. ........................... 711/5 |
| 7,126,399 B1 | 10/2006 | Lee ................................ 327/261 |
| 7,127,567 B2 | 10/2006 | Ramakrishnan et al. |
| 7,133,960 B1 | 11/2006 | Thompson et al. ............... 711/5 |
| 7,136,978 B2 | 11/2006 | Miura et al. .................... 711/165 |
| 7,138,823 B2 | 11/2006 | Janzen et al. |
| 7,149,145 B2 | 12/2006 | Kim et al. ...................... 365/233 |
| 7,149,824 B2 | 12/2006 | Johnson .......................... 710/35 |
| 7,173,863 B2 | 2/2007 | Conley et al. ................. 365/189 |
| 7,177,206 B2 | 2/2007 | Lee |
| 7,200,021 B2 | 4/2007 | Raghuram ....................... 365/51 |
| 7,205,789 B1 | 4/2007 | Karabatsos ...................... 326/30 |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,224,595 B2 | 5/2007 | Dreps et al. ..................... 365/63 |
| 7,228,264 B2 | 6/2007 | Barrenscheen et al. ........ 703/23 |
| 7,231,562 B2 | 6/2007 | Ohlhoff et al. |
| 7,233,541 B2 | 6/2007 | Yamamoto et al. ...... 365/230.03 |
| 7,234,081 B2 | 6/2007 | Nguyen et al. |
| 7,243,185 B2 | 7/2007 | See et al. |
| 7,245,541 B2 | 7/2007 | Janzen .......................... 365/198 |
| 7,254,036 B2 | 8/2007 | Pauley et al. ................... 361/721 |
| 7,266,639 B2 | 9/2007 | Raghuram ..................... 711/115 |
| 7,269,042 B2 | 9/2007 | Kinsley et al. .................. 365/52 |
| 7,269,708 B2 | 9/2007 | Ware ............................. 711/203 |
| 7,274,583 B2 | 9/2007 | Park et al. |
| 7,277,333 B2 | 10/2007 | Schaefer |
| 7,286,436 B2 | 10/2007 | Bhakta et al. ................. 365/230 |
| 7,289,386 B2 | 10/2007 | Bhakta et al. ................. 365/230 |
| 7,296,754 B2 | 11/2007 | Nishizawa et al. ............ 235/492 |
| 7,299,330 B2 | 11/2007 | Gillingham et al. .......... 711/167 |
| 7,302,598 B2 | 11/2007 | Suzuki et al. |
| 7,307,863 B2 | 12/2007 | Yen et al. ......................... 365/63 |
| 7,317,250 B2 | 1/2008 | Koh et al. |
| 7,327,613 B2 | 2/2008 | Lee |
| 7,336,490 B2 | 2/2008 | Harris et al. |
| 7,337,293 B2 | 2/2008 | Brittain et al. |
| 7,363,422 B2 | 4/2008 | Perego et al. .................. 711/105 |
| 7,366,947 B2 | 4/2008 | Gower et al. |
| 7,379,316 B2 | 5/2008 | Rajan ............................. 365/63 |
| 7,386,656 B2 | 6/2008 | Rajan et al. .................... 711/103 |
| 7,392,338 B2 | 6/2008 | Rajan et al. .................... 711/103 |
| 7,408,393 B1 | 8/2008 | Jain et al. ....................... 327/202 |
| 7,409,492 B2 | 8/2008 | Tanaka et al. ................. 711/103 |
| 7,414,917 B2 | 8/2008 | Ruckerbauer et al. |
| 7,428,644 B2 | 9/2008 | Jeddeloh et al. |
| 7,437,579 B2 | 10/2008 | Jeddeloh et al. ............... 713/300 |
| 7,441,064 B2 | 10/2008 | Gaskins |
| 7,457,122 B2 | 11/2008 | Lai et al. |
| 7,464,225 B2 | 12/2008 | Tsern ............................. 711/115 |
| 7,472,220 B2 | 12/2008 | Rajan et al. .................... 711/103 |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil ............................. 713/324 |
| 7,499,281 B2 | 3/2009 | Harris et al. |
| 7,515,453 B2 | 4/2009 | Rajan ............................. 365/63 |
| 7,532,537 B2 | 5/2009 | Solomon et al. .............. 365/230 |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,738,252 B2 | 6/2010 | Schuette et al. |
| 7,761,724 B2 | 7/2010 | Rajan et al. |
| 7,791,889 B2 | 9/2010 | Belady et al. |
| 7,911,798 B2 | 3/2011 | Chang et al. |
| 7,934,070 B2 | 4/2011 | Brittain et al. |
| 7,990,797 B2 | 8/2011 | Moshayedi et al. |
| 8,019,589 B2 | 9/2011 | Rajan et al. |
| 8,041,881 B2 | 10/2011 | Rajan et al. |
| 8,116,144 B2 * | 2/2012 | Shaw et al. |
| 8,122,207 B2 * | 2/2012 | Rajan et al. .................... 711/154 |
| 8,340,953 B2 | 12/2012 | Rajan et al. |
| 2001/0000822 A1 | 5/2001 | Dell et al. ...................... 711/170 |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yanagawa |
| 2001/0052062 A1 | 12/2001 | Lipovski |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0019961 A1 | 2/2002 | Blodgett ....................... 714/718 |
| 2002/0034068 A1 | 3/2002 | Weber et al. |
| 2002/0038405 A1 | 3/2002 | Leddige et al. ............... 711/115 |
| 2002/0040416 A1 | 4/2002 | Tsern et al. |
| 2002/0041507 A1 | 4/2002 | Woo et al. ...................... 365/51 |
| 2002/0051398 A1 | 5/2002 | Mizugaki ...................... 365/222 |
| 2002/0060945 A1 | 5/2002 | Ikeda |
| 2002/0060948 A1 | 5/2002 | Chang et al. |
| 2002/0064073 A1 | 5/2002 | Chien ............................ 365/200 |
| 2002/0064083 A1 | 5/2002 | Ryu et al. ...................... 365/233 |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar ............................ 713/320 |
| 2002/0129204 A1 | 9/2002 | Leighnor et al. |
| 2002/0145900 A1 | 10/2002 | Schaefer ......................... 365/52 |
| 2002/0165706 A1 | 11/2002 | Raynham ....................... 705/25 |
| 2002/0167092 A1 | 11/2002 | Fee et al. |
| 2002/0172024 A1 | 11/2002 | Hui et al. |
| 2002/0174274 A1 | 11/2002 | Wu et al. ....................... 710/100 |
| 2002/0184438 A1 | 12/2002 | Usui .............................. 711/106 |
| 2003/0002262 A1 | 1/2003 | Benisek et al. ............... 361/728 |
| 2003/0011993 A1 | 1/2003 | Summers et al. |
| 2003/0016550 A1 | 1/2003 | Yoo et al. |
| 2003/0021175 A1 | 1/2003 | Tae Kwak ..................... 365/219 |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1 | 2/2003 | Hou et al. |
| 2003/0061458 A1 | 3/2003 | Wilcox et al. ................. 711/167 |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0093614 A1 | 5/2003 | Kohn et al. ................... 711/105 |
| 2003/0101392 A1 | 5/2003 | Lee ................................ 714/718 |
| 2003/0105932 A1 | 6/2003 | David et al. .................. 711/167 |
| 2003/0110339 A1 | 6/2003 | Calvignac et al. |
| 2003/0117875 A1 | 6/2003 | Lee et al. ...................... 365/326 |
| 2003/0123389 A1 | 7/2003 | Russell et al. |
| 2003/0126338 A1 | 7/2003 | Dodd et al. ................... 710/305 |
| 2003/0127737 A1 | 7/2003 | Takahashi |
| 2003/0131160 A1 | 7/2003 | Hampel et al. ................. 710/22 |
| 2003/0145163 A1 | 7/2003 | Seo et al. ...................... 711/106 |
| 2003/0158995 A1 | 8/2003 | Lee et al. ...................... 711/105 |
| 2003/0164539 A1 | 9/2003 | Yau |
| 2003/0164543 A1 | 9/2003 | Kheng Lee |
| 2003/0174569 A1 | 9/2003 | Amidi |
| 2003/0182513 A1 | 9/2003 | Dodd et al. ................... 711/137 |

(56) References Cited

U.S. PATENT DOCUMENTS

| | | |
|---|---|---|
| 2003/0183934 A1 | 10/2003 | Barrett |
| 2003/0189868 A1 | 10/2003 | Riesenman et al. ............ 365/226 |
| 2003/0189870 A1 | 10/2003 | Wilcox ........................ 365/233 |
| 2003/0191888 A1 | 10/2003 | Klein ........................... 711/105 |
| 2003/0191915 A1 | 10/2003 | Saxena et al. ............... 711/160 |
| 2003/0200382 A1 | 10/2003 | Wells et al. .................. 711/106 |
| 2003/0200474 A1 | 10/2003 | Li ................................. 713/320 |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1 | 12/2003 | Park et al. .................... 365/200 |
| 2003/0227798 A1 | 12/2003 | Pax ............................. 365/189.12 |
| 2003/0229821 A1 | 12/2003 | Ma ................................. 714/8 |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. ............................. 365/226 |
| 2003/0234664 A1 | 12/2003 | Yamagata |
| 2004/0000708 A1 | 1/2004 | Rapport et al. |
| 2004/0016994 A1 | 1/2004 | Huang |
| 2004/0027902 A1 | 2/2004 | Ooishi et al. |
| 2004/0034732 A1 | 2/2004 | Valin et al. ..................... 711/4 |
| 2004/0034755 A1 | 2/2004 | LaBerge et al. |
| 2004/0037133 A1 | 2/2004 | Park et al. .................... 365/202 |
| 2004/0042503 A1 | 3/2004 | Shaeffer et al. |
| 2004/0044808 A1 | 3/2004 | Salmon et al. .................... 710/8 |
| 2004/0047228 A1 | 3/2004 | Chen ............................. 365/232 |
| 2004/0049624 A1 | 3/2004 | Salmonsen |
| 2004/0057317 A1 | 3/2004 | Schaefer |
| 2004/0064647 A1 | 4/2004 | DeWhitt et al. .............. 711/135 |
| 2004/0064767 A1 | 4/2004 | Huckaby et al. ............. 714/710 |
| 2004/0083324 A1 | 4/2004 | Rabinovitz et al. |
| 2004/0088475 A1 | 5/2004 | Streif et al. ................... 711/105 |
| 2004/0100837 A1 | 5/2004 | Lee |
| 2004/0117723 A1 | 6/2004 | Foss .............................. 714/805 |
| 2004/0123173 A1 | 6/2004 | Emberling et al. .......... 714/733 |
| 2004/0125635 A1 | 7/2004 | Kuzmenka |
| 2004/0133374 A1 | 7/2004 | Kattan |
| 2004/0133736 A1 | 7/2004 | Kyung .......................... 711/105 |
| 2004/0139359 A1 | 7/2004 | Samson et al. ............... 713/320 |
| 2004/0145963 A1 | 7/2004 | Byon ............................. 365/233 |
| 2004/0151038 A1 | 8/2004 | Ruckerbauer et al. |
| 2004/0174765 A1 | 9/2004 | Seo et al. ...................... 365/233 |
| 2004/0177079 A1 | 9/2004 | Gluhovsky et al. .......... 707/100 |
| 2004/0178824 A1 | 9/2004 | Pan |
| 2004/0184324 A1 | 9/2004 | Pax ............................... 365/189.12 |
| 2004/0186956 A1 | 9/2004 | Perego et al. ................. 711/115 |
| 2004/0188704 A1 | 9/2004 | Halbert et al. ................ 257/145 |
| 2004/0195682 A1 | 10/2004 | Kimura |
| 2004/0196732 A1 | 10/2004 | Lee ................................ 365/233 |
| 2004/0205433 A1 | 10/2004 | Gower et al. |
| 2004/0208173 A1 | 10/2004 | Di Gregorio ................. 370/360 |
| 2004/0225858 A1 | 11/2004 | Brueggen |
| 2004/0228166 A1 | 11/2004 | Braun et al. .................. 365/154 |
| 2004/0228196 A1 | 11/2004 | Kwak et al. |
| 2004/0228203 A1 | 11/2004 | Koo ............................... 365/233 |
| 2004/0230932 A1 | 11/2004 | Dickmann ....................... 716/10 |
| 2004/0236877 A1 | 11/2004 | Burton |
| 2004/0250989 A1 | 12/2004 | Im et al. |
| 2004/0256638 A1 | 12/2004 | Perego et al. ................. 257/200 |
| 2004/0257847 A1 | 12/2004 | Matsui et al. |
| 2004/0257857 A1 | 12/2004 | Yamamoto et al. |
| 2004/0260957 A1 | 12/2004 | Jeddeloh et al. ............. 713/300 |
| 2004/0264255 A1 | 12/2004 | Royer ........................... 365/189.01 |
| 2004/0268161 A1 | 12/2004 | Ross .............................. 713/300 |
| 2005/0018495 A1 | 1/2005 | Bhakta et al. ................. 365/19 |
| 2005/0021874 A1 | 1/2005 | Georgiou et al. ............. 709/250 |
| 2005/0024963 A1 | 2/2005 | Jakobs et al. |
| 2005/0027928 A1 | 2/2005 | Avraham et al. ............. 711/103 |
| 2005/0028038 A1 | 2/2005 | Pomaranski et al. ......... 714/42 |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. ..................... 711/5 |
| 2005/0044305 A1 | 2/2005 | Jakobs et al. ................. 711/105 |
| 2005/0047192 A1 | 3/2005 | Matsui et al. ................. 365/145 |
| 2005/0071543 A1 | 3/2005 | Ellis et al. ..................... 711/106 |
| 2005/0078532 A1 | 4/2005 | Ruckerbauer et al. ........ 365/199 |
| 2005/0081085 A1 | 4/2005 | Ellis et al. ........................ 714/5 |
| 2005/0086548 A1 | 4/2005 | Haid et al. |
| 2005/0099834 A1 | 5/2005 | Funaba et al. |
| 2005/0102590 A1 | 5/2005 | Norris et al. ................. 714/719 |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. ............... 711/167 |
| 2005/0135176 A1 | 6/2005 | Ramakrishnan et al. |
| 2005/0138267 A1 | 6/2005 | Bains et al. ................... 711/100 |
| 2005/0138304 A1 | 6/2005 | Ramakrishnan et al. |
| 2005/0139977 A1 | 6/2005 | Nishio et al. ................. 257/686 |
| 2005/0141199 A1 | 6/2005 | Chiou et al. .................. 361/704 |
| 2005/0149662 A1 | 7/2005 | Perego et al. ..................... 711/5 |
| 2005/0152212 A1 | 7/2005 | Yang et al. .................... 365/233 |
| 2005/0156934 A1 | 7/2005 | Perego et al. |
| 2005/0166026 A1 | 7/2005 | Ware et al. .................... 711/167 |
| 2005/0193163 A1 | 9/2005 | Perego et al. ................. 711/105 |
| 2005/0193183 A1 | 9/2005 | Barth et al. |
| 2005/0194676 A1 | 9/2005 | Fukuda et al. |
| 2005/0194991 A1 | 9/2005 | Dour et al. ..................... 326/30 |
| 2005/0195629 A1 | 9/2005 | Leddige et al. ................ 365/51 |
| 2005/0201063 A1 | 9/2005 | Lee et al. |
| 2005/0204111 A1 | 9/2005 | Natarajan ..................... 711/167 |
| 2005/0207255 A1 | 9/2005 | Perego et al. |
| 2005/0210196 A1 | 9/2005 | Perego et al. ................. 711/115 |
| 2005/0223179 A1 | 10/2005 | Perego et al. ................. 711/154 |
| 2005/0224948 A1 | 10/2005 | Lee et al. |
| 2005/0232049 A1 | 10/2005 | Park |
| 2005/0235119 A1 | 10/2005 | Sechrest et al. .............. 711/158 |
| 2005/0235131 A1 | 10/2005 | Ware ............................ 711/203 |
| 2005/0237838 A1 | 10/2005 | Kwak et al. .................. 365/222 |
| 2005/0243635 A1 | 11/2005 | Schaefer ....................... 365/227 |
| 2005/0246558 A1 | 11/2005 | Ku |
| 2005/0249011 A1 | 11/2005 | Maeda |
| 2005/0259504 A1 | 11/2005 | Murtugh et al. .............. 365/233 |
| 2005/0263312 A1 | 12/2005 | Bolken et al. |
| 2005/0265506 A1 | 12/2005 | Foss et al. ..................... 375/376 |
| 2005/0269715 A1 | 12/2005 | Yoo |
| 2005/0278474 A1 | 12/2005 | Perersen et al. ................. 711/5 |
| 2005/0281096 A1 | 12/2005 | Bhakta et al. |
| 2005/0281123 A1 | 12/2005 | Bell et al. ................. 365/230.08 |
| 2005/0283572 A1 | 12/2005 | Ishihara |
| 2005/0285174 A1 | 12/2005 | Saito et al. .................... 257/296 |
| 2005/0286334 A1 | 12/2005 | Saito et al. |
| 2005/0289292 A1 | 12/2005 | Morrow et al. .............. 711/105 |
| 2005/0289317 A1 | 12/2005 | Liou et al. .................... 711/170 |
| 2006/0002201 A1 | 1/2006 | Janzen .......................... 365/191 |
| 2006/0010339 A1 | 1/2006 | Klein ............................... 714/5 |
| 2006/0026484 A1 | 2/2006 | Hollums ....................... 714/746 |
| 2006/0038597 A1 | 2/2006 | Becker et al. |
| 2006/0039204 A1 | 2/2006 | Cornelius |
| 2006/0039205 A1 | 2/2006 | Cornelius ................. 365/189.05 |
| 2006/0041711 A1 | 2/2006 | Miura et al. .................. 711/103 |
| 2006/0041730 A1 | 2/2006 | Larson .......................... 711/167 |
| 2006/0044909 A1 | 3/2006 | Kinsley et al. ............... 365/222 |
| 2006/0044913 A1 | 3/2006 | Klein et al. |
| 2006/0049502 A1 | 3/2006 | Goodwin et al. |
| 2006/0050574 A1 | 3/2006 | Streif et al. ................... 365/194 |
| 2006/0056244 A1 | 3/2006 | Ware ............................ 365/194 |
| 2006/0062047 A1 | 3/2006 | Bhakta et al. |
| 2006/0067141 A1 | 3/2006 | Perego et al. |
| 2006/0085616 A1 | 4/2006 | Zeighami et al. ............ 711/167 |
| 2006/0087900 A1 | 4/2006 | Bucksch et al. |
| 2006/0090031 A1 | 4/2006 | Kirshenbaum et al. ........ 711/113 |
| 2006/0090054 A1 | 4/2006 | Choi et al. .................... 711/167 |
| 2006/0106951 A1 | 5/2006 | Bains .............................. 710/5 |
| 2006/0112214 A1 | 5/2006 | Yeh ............................... 711/103 |
| 2006/0112219 A1 | 5/2006 | Chawla et al. |
| 2006/0117152 A1 | 6/2006 | Amidi et al. .................. 711/154 |
| 2006/0117160 A1 | 6/2006 | Jackson et al. ............... 711/170 |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |

(56) References Cited

U.S. PATENT DOCUMENTS

| | | | |
|---|---|---|---|
| 2006/0129712 A1 | 6/2006 | Raghuram | 710/52 |
| 2006/0129740 A1 | 6/2006 | Ruckerbauer et al. | |
| 2006/0129755 A1 | 6/2006 | Raghuram | 711/105 |
| 2006/0133173 A1 | 6/2006 | Jain et al. | |
| 2006/0136791 A1 | 6/2006 | Nierle | |
| 2006/0149857 A1 | 7/2006 | Holman | |
| 2006/0149982 A1 | 7/2006 | Vogt | 713/320 |
| 2006/0174082 A1 | 8/2006 | Bellows et al. | |
| 2006/0176744 A1 | 8/2006 | Stave | 365/194 |
| 2006/0179262 A1 | 8/2006 | Brittain et al. | |
| 2006/0179333 A1 | 8/2006 | Brittain et al. | 713/320 |
| 2006/0179334 A1 | 8/2006 | Brittain et al. | 713/320 |
| 2006/0180926 A1 | 8/2006 | Mullen et al. | |
| 2006/0181953 A1 | 8/2006 | Rotenberg et al. | |
| 2006/0195631 A1 | 8/2006 | Rajamani | |
| 2006/0198178 A1 | 9/2006 | Kinsley et al. | |
| 2006/0203590 A1 | 9/2006 | Mori et al. | |
| 2006/0206738 A1 | 9/2006 | Jeddeloh et al. | 713/320 |
| 2006/0233012 A1 | 10/2006 | Sekiguchi et al. | |
| 2006/0236165 A1 | 10/2006 | Cepulis et al. | |
| 2006/0236201 A1 | 10/2006 | Gower et al. | |
| 2006/0248261 A1 | 11/2006 | Jacob et al. | |
| 2006/0248387 A1 | 11/2006 | Nicholson et al. | 714/22 |
| 2006/0262586 A1 | 11/2006 | Solomon et al. | |
| 2006/0262587 A1 | 11/2006 | Matsui et al. | |
| 2006/0277355 A1 | 12/2006 | Ellsberry et al. | |
| 2006/0294295 A1 | 12/2006 | Fukuzo | 711/105 |
| 2007/0005998 A1 | 1/2007 | Jain et al. | |
| 2007/0011421 A1 | 1/2007 | Keller et al. | |
| 2007/0050530 A1 | 3/2007 | Rajan | 711/5 |
| 2007/0058471 A1 | 3/2007 | Rajan et al. | 365/222 |
| 2007/0070669 A1 | 3/2007 | Tsern | |
| 2007/0088995 A1 | 4/2007 | Tsern et al. | 714/724 |
| 2007/0091696 A1 | 4/2007 | Niggemeier et al. | |
| 2007/0106860 A1 | 5/2007 | Foster et al. | 711/170 |
| 2007/0136537 A1 | 6/2007 | Doblar et al. | |
| 2007/0152313 A1 | 7/2007 | Periaman et al. | |
| 2007/0162700 A1 | 7/2007 | Fortin et al. | 711/118 |
| 2007/0188997 A1 | 8/2007 | Hockanson et al. | |
| 2007/0192563 A1 | 8/2007 | Rajan et al. | 711/202 |
| 2007/0195613 A1 | 8/2007 | Rajan et al. | 365/189.05 |
| 2007/0204075 A1 | 8/2007 | Rajan et al. | |
| 2007/0216445 A1 | 9/2007 | Raghavan et al. | 326/83 |
| 2007/0247194 A1 | 10/2007 | Jain | 326/87 |
| 2007/0279084 A1 | 12/2007 | Oh et al. | |
| 2007/0285895 A1 | 12/2007 | Gruendler et al. | |
| 2007/0288683 A1 | 12/2007 | Panabaker et al. | 711/101 |
| 2007/0288686 A1 | 12/2007 | Arcedera et al. | 711/103 |
| 2007/0288687 A1 | 12/2007 | Panabaker et al. | 711/103 |
| 2007/0290333 A1 | 12/2007 | Saini et al. | |
| 2008/0002447 A1 | 1/2008 | Gulachenski et al. | |
| 2008/0010435 A1 | 1/2008 | Smith et al. | |
| 2008/0025108 A1 | 1/2008 | Rajan et al. | 365/189.05 |
| 2008/0025122 A1 | 1/2008 | Schakel et al. | 365/222 |
| 2008/0025136 A1 | 1/2008 | Rajan et al. | 365/230.08 |
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0034130 A1 | 2/2008 | Perego et al. | |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | 711/105 |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |
| 2008/0109597 A1 | 5/2008 | Schakel et al. | |
| 2008/0109598 A1 | 5/2008 | Schakel et al. | |
| 2008/0115006 A1 | 5/2008 | Smith et al. | 713/601 |
| 2008/0120443 A1 | 5/2008 | Rajan et al. | |
| 2008/0120458 A1 | 5/2008 | Gillingham et al. | 711/105 |
| 2008/0123459 A1 | 5/2008 | Rajan et al. | 365/227 |
| 2008/0126624 A1 | 5/2008 | Prete et al. | |
| 2008/0126687 A1 | 5/2008 | Rajan et al. | |
| 2008/0126688 A1 | 5/2008 | Rajan et al. | |
| 2008/0126689 A1 | 5/2008 | Rajan et al. | |
| 2008/0126690 A1 | 5/2008 | Rajan et al. | 711/105 |
| 2008/0126692 A1 | 5/2008 | Rajan et al. | |
| 2008/0130364 A1 | 6/2008 | Guterman et al. | |
| 2008/0133825 A1 | 6/2008 | Rajan et al. | |
| 2008/0155136 A1 | 6/2008 | Hishino | |
| 2008/0159027 A1 | 7/2008 | Kim | |
| 2008/0170425 A1 | 7/2008 | Rajan | |
| 2008/0195894 A1 | 8/2008 | Schreck et al. | |
| 2008/0215832 A1 | 9/2008 | Allen et al. | |
| 2008/0239857 A1 | 10/2008 | Rajan et al. | 365/227 |
| 2008/0239858 A1 | 10/2008 | Rajan et al. | 365/227 |
| 2008/0256282 A1 | 10/2008 | Guo et al. | |
| 2008/0282084 A1 | 11/2008 | Hatakeyama | |
| 2008/0282341 A1 | 11/2008 | Hatakeyama | |
| 2009/0024789 A1 | 1/2009 | Rajan et al. | |
| 2009/0024790 A1 | 1/2009 | Rajan et al. | |
| 2009/0049266 A1 | 2/2009 | Kuhne | |
| 2009/0063865 A1 | 3/2009 | Berenbaum et al. | |
| 2009/0063896 A1 | 3/2009 | Lastras-Montano et al. | |
| 2009/0070520 A1 | 3/2009 | Mizushima | |
| 2009/0089480 A1 | 4/2009 | Wah et al. | |
| 2009/0109613 A1 | 4/2009 | Legen et al. | |
| 2009/0180926 A1 | 7/2009 | Petruno et al. | |
| 2009/0216939 A1 | 8/2009 | Smith et al. | |
| 2009/0285031 A1 | 11/2009 | Rajan et al. | |
| 2009/0290442 A1 | 11/2009 | Rajan | |
| 2010/0005218 A1 | 1/2010 | Gower et al. | |
| 2010/0020585 A1 | 1/2010 | Rajan | |
| 2010/0257304 A1 | 10/2010 | Rajan et al. | |
| 2010/0271888 A1 | 10/2010 | Rajan | |
| 2010/0281280 A1 | 11/2010 | Rajan et al. | |

FOREIGN PATENT DOCUMENTS

| | | | |
|---|---|---|---|
| DE | 102005036528 | 2/2007 | G11C 7/10 |
| EP | 0132129 | 1/1985 | |
| EP | 0644547 | 3/1995 | |
| JP | 62121978 | 6/1987 | G06F 12/06 |
| JP | 01171047 | 7/1989 | G06F 12/16 |
| JP | 03-029357 | 2/1991 | H01L 27/04 |
| JP | 03029357 | 2/1991 | H01L 21/822 |
| JP | 03/276487 | 12/1991 | G11C 11/401 |
| JP | 03286234 | 12/1991 | G06F 12/06 |
| JP | 05-298192 | 11/1993 | |
| JP | 07-141870 | 6/1995 | G11C 11/407 |
| JP | 08/077097 | 3/1996 | G06F 13/16 |
| JP | 08077097 | 3/1996 | G06F 12/00 |
| JP | 2008-179994 | 7/1996 | |
| JP | 09-231127 | 9/1997 | |
| JP | 10-233091 | 9/1998 | |
| JP | 10-260895 | 9/1998 | |
| JP | 10233091 | 10/1998 | |
| JP | 11-073773 | 3/1999 | |
| JP | 11-149775 | 6/1999 | G11C 11/407 |
| JP | 11-224221 | 8/1999 | |
| JP | 2002025255 | 1/2002 | G11C 7/10 |
| JP | 3304893 B2 | 5/2002 | |
| JP | 2002-288037 | 10/2002 | |
| JP | 2002288037 | 10/2002 | |
| JP | 04-327474 | 11/2004 | |
| JP | 2005062914 | 3/2005 | |
| JP | 2005108224 | 4/2005 | |
| JP | 2006236388 | 9/2006 | G06F 12/00 |
| KR | 1999-0076659 | 10/1999 | |
| KR | 1020040062717 | 7/2004 | G11C 5/02 |
| KR | 2005120344 | 12/2005 | |
| WO | WO 95/05676 | 2/1995 | H01L 25/00 |

(56) References Cited

FOREIGN PATENT DOCUMENTS

| WO | WO9900734 | 1/1999 | ............... G11C 7/10 |
|----|-----------|--------|---------------------------|
| WO | WO00/45270 | 8/2000 | |
| WO | WO01/37090 | 5/2001 | |
| WO | 01/90900 | 11/2001 | |
| WO | 01/97160 | 12/2001 | |
| WO | WO 2004/044754 | 5/2004 | |
| WO | WO2004/051645 | 6/2004 | |
| WO | WO 2006/072040 | 7/2006 | |
| WO | WO2007002324 | 1/2007 | ............ G11C 29/00 |
| WO | WO2007/028109 | 3/2007 | |
| WO | WO 2007/038225 | 4/2007 | ............... G01V 5/00 |
| WO | WO2007/095080 | 8/2007 | |
| WO | WO2008063251 | 5/2008 | ............... G11C 5/14 |

OTHER PUBLICATIONS

Non-Final Office Action from U.S. Appl. No. 13/260,650, Dated Feb. 1, 2013.
Notice of Allowance from U.S. Appl. No. 13/141,844, Dated Feb. 5, 2013.
Kellerbauer "Die Schnelle Million," with translation, "The quick million."
Wu et al., "eNVy: A Non-Volatile, Main Memory Storage System," to appear in ASPLOS VI.
"Using Two Chip Selects to Enable Quad Rank," IP.com PriorArtDatabase, copyright IP.com, Inc. 2004.
"Bios and Kernel Developer's Guide (BKDG) for AMD Family 10h Processors," AMD, 31116 Rev 3.00, Sep. 7, 2007.
Skerlj et al., "Buffer Device for Memory Modules (DIMM)" Qimonda 2006, p. 1.
Written Opinion from PCT Application No. PCT/US06/24360 mailed on Jan. 8, 2007.
Preliminary Report on Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
International Search Report and Written Opinion from PCT Application No. PCT/US07/16385 mailed on Jul. 30, 2008.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
Wu et al., "eNVy: A Non-Volatile, Main Memory Storage System," ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994).
Form AO-120 as filed in US Patent No. 7,472,220 on Jun. 17, 2009.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Supplemental European Search Report and Search Opinion issued on Sep. 21, 2009 in corresponding European Application No. 07870726.2, 8 pages.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,655 Mailed Mar. 3, 2010.
Non-Final Office Action from U.S. Appl. No. 11/939,432 Mailed Apr. 12, 2010.

(56) References Cited

OTHER PUBLICATIONS

Notice of Allowance from U.S. Appl. No. 12/111,819 Mailed Mar. 10, 2010.

Non-Final Office Action from U.S. Appl. No. 12/507,682 Mailed Mar. 8, 2010.

Great Britain Office Action from GB Patent Application No. GB0803913.3 Mailed Mar. 1, 2010.

Final Office Action from U.S. Appl. No. 11/461,435 Dated May 13, 2010.

Final Office Action from U.S. Appl. No. 11/515,167 Dated Jun. 3, 2010.

Notice of Allowance from U.S. Appl. No. 11/515,223 Dated Jul. 30, 2010.

Final Office Action from U.S. Appl. No. 11/553,390 Dated Jun. 24, 2010.

Notice of Allowance from U.S. Appl. No. 11/611,374 Dated Jul. 19, 2010.

Final Office Action from U.S. Appl. No. 11/672,921 Dated Jul. 23, 2010.

Final Office Action from U.S. Appl. No. 11/702,960 Dated Jun. 21, 2010.

Notice of Allowance from U.S. Appl. No. 11/762,010 Dated Jul. 2, 2010.

Notice of Allowance from U.S. Appl. No. 11/763,365 Dated Jun. 29, 2010.

Final Office Action from U.S. Appl. No. 11/929,500 Dated Jun. 24, 2010.

Office Action from U.S. Appl. No. 12/574,628 Dated Jun. 10, 2010.

Non-Final Office Action from U.S. Appl. No. 11/461,420 Dated Jul. 23, 2009.

Notice of Allowance from U.S. Appl. No. 11/461,430 Dated Sep. 9, 2009.

Non-Final Office Action from U.S. Appl. No. 11/461,435 Dated Aug. 5, 2009.

Non-Final Office Action from U.S. Appl. No. 11/515,167 Dated Sep. 25, 2009.

Non-Final Office Action from U.S. Appl. No. 11/515,223 Dated Sep. 22, 2009.

Non-Final Office Action from U.S. Appl. No. 11/538,041 Dated Jun. 10, 2009.

Non-Final Office Action from U.S. Appl. No. 11/553,372 Dated Jun. 25, 2009.

Notice of Allowance from U.S. Appl. No. 11/553,372 Dated Sep. 30, 2009.

Non-Final Office Action from U.S. Appl. No. 11/553,390 Dated Sep. 9, 2009.

Non-Final Office Action from U.S. Appl. No. 11/553,399 Dated Jul. 7, 2009.

Notice of Allowance from U.S. Appl. No. 11/553,399 Dated Oct. 13, 2009.

Notice of Allowance from U.S. Appl. No. 11/611,374 Dated Sep. 15, 2009.

Non-Final Office Action from U.S. Appl. No. 11/702,960 Dated Sep. 25, 2009.

Non-Final Office Action from U.S. Appl. No. 11/702,981 Dated Aug. 19, 2009.

Non-Final Office Action from U.S. Appl. No. 11/762,013 Dated Jun. 5, 2009.

Non-Final Office Action from U.S. Appl. No. 11/763,365 Dated Oct. 28, 2009.

Non-Final Office Action from U.S. Appl. No. 11/858,518 Dated Aug. 14, 2009.

Non-Final Office Action from U.S. Appl. No. 11/929,500 Dated Oct. 13, 2009.

Notice of Allowance from U.S. Appl. No. 11/939,432 Dated Sep. 24, 2009.

Non-Final Office Action from U.S. Appl. No. 11/941,589 Dated Oct. 1, 2009.

Wu et al., "eNVy: A Non-Volatile, Main Memory Storage System", ASPLOS-VI Proceedings, Oct. 4-7, 1994, pp. 86-97.

Buffer Device for Memory Modules (DIMM), IP.com Prior Art Database, <URL: http://ip.com/IPCOM/000144850>, Feb. 10, 2007, 1 pg.

German Office Action from German Patent Application No. 11 2006 002 300.4-55 Dated May 11, 2009 (With Translation).

Great Britain Office Action from GB Patent Application No. GB0803913.3 Dated Mar. 1, 2010.

International Preliminary Examination Report From PCT Application No. PCT/US07/016385 Dated Feb. 3, 2009.

Search Report and Written Opinion From PCT Application No. PCT/US07/03460 Dated on Feb. 14, 2008.

Notice of Allowance from U.S. Appl. No. 11/553,372 Dated Aug. 4, 2010.

Notice of Allowance from U.S. Appl. No. 11/553,399 Dated Dec. 3, 2010.

Notice of Allowance from U.S. Appl. No. 11/611,374 Dated Oct. 29, 2010.

Final Office Action from U.S. Appl. No. 11/672,924 Dated Sep. 7, 2010.

Non-Final Office Action from U.S. Appl. No. 11/702,981 Dated Mar. 11, 2009.

Notice of Allowance from U.S. Appl. No. 11/762,010 Dated Oct. 22, 2010.

Notice of Allowance from U.S. Appl. No. 11/762,013 Dated Aug. 17, 2010.

Notice of Allowance from U.S. Appl. No. 11/762,013 Dated Dec. 7, 2010.

Notice of Allowance from U.S. Appl. No. 11/763,365 Dated Oct. 20, 2010.

Non-Final Office Action from U.S. Appl. No. 11/855,805 Dated Sep. 21, 2010.

Non-Final Office Action from U.S. Appl. No. 11/858,518 Dated Sep. 8, 2010.

Final Office Action from U.S. Appl. No. 11/929,225 Dated Aug. 27, 2010.

Final Office Action from U.S. Appl. No. 11/929,261 Dated Sep. 7, 2010.

Final Office Action from U.S. Appl. No. 11/929,286 Dated Aug. 20, 2010.

Notice of Allowance from U.S. Appl. No. 11/929,320 Dated Sep. 29, 2010.

Final Office Action from U.S. Appl. No. 11/929,403 Dated Aug. 31, 2010.

Final Office Action from U.S. Appl. No. 11/929,417 Dated Aug. 31, 2010.

Final Office Action from U.S. Appl. No. 11/929,432 Dated Aug. 20, 2010.

Final Office Action from U.S. Appl. No. 11/929,450 Dated Aug. 20, 2010.

Notice of Allowance from U.S. Appl. No. 11/929,483 Dated Oct. 7, 2010.

Final Office Action from U.S. Appl. No. 11/929,631 Dated Nov. 18, 2010.

Final Office Action from U.S. Appl. No. 11/929,655 Dated Nov. 22, 2010.

Non-Final Office Action from U.S. Appl. No. 11/939,440 Dated Sep. 17, 2010.

Notice of Allowance from U.S. Appl. No. 11/941,589 Dated Oct. 25, 2010.

Non-Final Office Action from U.S. Appl. No. 12/057,306 Dated Oct. 8, 2010.

Non-Final Office Action from U.S. Appl. No. 12/203,100 Dated Dec. 1, 2010.

Non-Final Office Action from U.S. Appl. No. 12/769,428 Dated Nov. 8, 2010.

Non-Final Office Action from U.S. Appl. No. 12/838,896 Dated Sep. 3, 2010.

Search Report From PCT Application No. PCT/US10/038041 Dated Aug. 23, 2010.

Non-Final Office Action from U.S. Appl. No. 11/461,437 Dated Jan. 4, 2011.

Notice of Allowance from U.S. Appl. No. 11/515,223 Dated Feb. 4, 2011.

(56) References Cited

OTHER PUBLICATIONS

Non-Final Office Action from U.S. Appl. No. 11/553,372 Dated Jan. 5, 2011.
Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice of Allowance from U.S. Appl. No. 11/939,432 Dated Feb. 18, 2011.
Notice of Allowance from U.S. Appl. No. 12/144,396 Dated Feb. 1, 2011.
Non-Final Office Action from U.S. Appl. No. 12/816,756 Dated Feb. 7, 2011.
Notice of Allowance from U.S. Appl. No. 11/762,013 Dated Feb. 22, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Office Action from U.S. Appl. No. 11/929,417 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 29, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from related Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
Final Office Action from U.S. Appl. No. 11/828,181 Dated Feb. 23, 2012.
Non-Final Office Action from U.S. Appl. No. 13/276,212 Dated Mar. 15, 2012.

(56) References Cited

OTHER PUBLICATIONS

Notice of Allowance from U.S. Appl. No. 12/769,428 Dated Nov. 28, 2011.
Office Action, including English translation, from co-pending Japanese application No. 2008-529353, Dated Jan. 10, 2012.
International Search Report for Application No. EP12150807 Dated Feb. 16, 2012.
Non-Final Office Action from U.S. Appl. No. 11/461,520 Dated Feb. 29, 2012.
Notice of Allowance from U.S. Appl. No, 12/574,628 Dated Mar. 6, 2012.
Notice of Allowance from U.S. Appl. No. 11/939,440 Dated Mar. 30, 2012.
European Search Report from co-pending European U.S. Appl. No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553/372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Office Action, including English translation, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
Office Action, including English translation, from co-pending Japanese application No. 2008-529353, Dated Dec. 27, 2012.
Office Action from co-pending European patent application No. EP12150798, Dated Jan. 3, 2013.
Search Report from co-pending European Patent Application No. 13191794, dated Dec. 12, 2013.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Office Action from co-pending Japanese patent application No. 2012-132119, Dated Mar. 6, 2013.
Notice of Allowance from U.S. Appl. No. 11/461,435, Dated Mar. 6, 2013.
Notice of Allowance from U.S. Appl. No. 11/515,223, Dated Mar. 18, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
English translation of Office Action from co-pending Korean patent application No. KR1020087019582, Dated Mar. 13, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
EPO Communication for Co-pending European patent application No. EP11194862.6, dated May 5, 2013.
Non-Final Office Action from U.S. Appl. No. 13/620,793, Dated May 6, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/455,691, Dated Jun. 4, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Non-Final Office Action from U.S. Appl. No. 11/929,655, Dated Jun. 21, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.

(56) References Cited

OTHER PUBLICATIONS

Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 12/507,683, Dated Aug. 27, 2013.
Non-Final Office Action from U.S. Appl. No. 13/315,933, Dated Aug. 27, 2013.
Final Office Action from U.S. Appl. No. 13/620,650, Dated Aug. 30, 2013.
Notice of Allowance from U.S. Appl. No. 13/620,424, Dated Sep. 11, 2013.
Non-Final Office Action from U.S. Appl. No. 13/620,291, Dated Sep. 12, 2013.
Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
Notice of Allowance from U.S. Appl. No. 13/615,008, dated Dec. 3, 2013.
Notice of Allowance from U.S. Appl. No. 13/620,425, dated Dec. 11, 2013.
English Translation of Office Action from co-pending Japanese patent application No. P2012-197675, Dec. 3, 2013.
English Translation of Office Action from co-pending Japanese patent application No. P2012-197678, Dec. 3, 2013.
Notice of Allowance from U.S. Appl. No. 13/455,691, dated Dec. 31, 2013.
Non-Final Office Action from U.S. Appl. No. 11/553,390, dated Dec. 31, 2013.
English Translation of Office Action from co-pending Korean patent application No. 10-2013-7004006, dated Dec. 26, 2013.
English Translation of Office Action from co-pending Japanese patent application No. 2012-132119, dated Jan. 7, 2014.
Notice of Allowance from U.S. Appl. No. 13/620,425, dated Jan. 13, 2014.
Office Action from co-pending Korean patent application No. 10-2013-7029741, dated Dec. 20, 2013.
Notice of Allowance from U.S. Appl. No. 13/279,068, dated Jan. 21, 2014.
Notice of Allowance from U.S. Appl. No. 13/620,412, dated Jan. 21, 2014.
Non-Final Office Action from U.S. Appl. No. 13,367,182, dated Jan. 29, 2014.
Notice of Allowance from U.S. Appl. No. 13/898,002, dated Feb. 3, 2014.
Search Report from co-pending European Patent Application No. 13191796, dated Feb. 10, 2014.
Notice of Allowance from U.S. Appl. No. 13/620,424, dated Feb. 11, 2014.
Notice of Allowance from U.S. Appl. No. 13/620,565, dated Feb. 24, 2014.
Notice of Allowance from U.S. Appl. No. 13/315,933, dated Feb. 26, 2014.
Notice of Allowance from U.S. Appl. No. 13/620,207, dated Mar. 6, 2014.
Notice of Allowance from U.S. Appl. No. 13/455,691, dated Mar. 10, 2014.
Notice of Allowance from U.S. Appl. No. 13/620,199, dated Mar. 11, 2014.
Notice of Allowance from U.S. Appl. No. 13/620,425, dated Mar. 31, 2014.
Final Office Action from U.S. Appl. No. 13/367,182, dated Apr. 1, 2014.
Final Office Action from U.S. Appl. No. 12/507,682, dated Apr. 2, 2014.
Notice of Allowance from U.S. Appl. No. 11/515,167, dated Apr. 2, 2014.
Non-Final Office Action from U.S. Appl. No. 13/620,793, dated Apr. 9, 2014.
Woo et al. ("An Optimized 3D,Stacked Memory Architecture by Exploiting Excessive, High,Density TSV Bandwidth, by Dong Hyuk Woo," 987-1-4244-5659-8/09/02009, IEEE, 2009 doi:10.1109/HPCA.2010.5416628), 12 pages.
Final Office Action from U.S. Appl. No. 13/343,852, dated Apr. 18, 2014.
Final Office Action from U.S. Appl. No. 11/672,924, dated May 8, 2014.
English translation of Office Action from co-pending Korean patent application No. 10-2014-7005128, dated Apr. 10, 2014.
Notice of Allowance from U.S. Appl. No. 13/620,565, dated Jun. 4, 2014.
Non-Final Office Action from U.S. Appl. No. 11/553,390, dated Jul. 8, 2014.
Notice of Allowance from U.S. Appl. No. 13/367,182, dated Jul. 18, 2014.
Non-Final Office Action from U.S. Appl. No. 14/090,342, dated Aug. 13, 2014.
Office Action from Japanese Application No. JP2012-197678, dated Jul. 29, 2014.
Office Action from Japanese Application No. JP2012-197675, dated Jul. 29, 2014.
Notice of Allowance from U.S. Appl. No. 12/507,682, dated Sep. 26, 2014.
Notice of Allowance from U.S. Appl. No. 13/620,793, dated Oct. 9, 2014.

* cited by examiner

POWER MANAGEMENT OF MEMORY CIRCUITS BY VIRTUAL MEMORY SIMULATION

RELATED APPLICATION(S)

The application is a continuation of U.S. application Ser. No. 13/343,612, filed on Jan. 4, 2012, now U.S. Pat. No. 8,407,412, which is a continuation of U.S. application Ser. No. 12/816,756, filed on Jun. 16, 2010, now U.S. Pat. No. 8,122,207, which is a continuation of U.S. application Ser. No. 11/538,041, now abandoned, filed on Oct. 2, 2006, which is a continuation-in-part of U.S. application Ser. No. 11/524,811, filed on Sep. 20, 2006, now U.S. Pat. No. 7,590,796, which is a continuation-in-part of U.S. application Ser. No. 11/461,439, filed on Jul. 31, 2006, now U.S. Pat. No. 7,580,312. The disclosures of the above-identified patent applications are expressly incorporated herein by reference.

FIELD OF THE INVENTION

The present invention relates to memory, and more particularly to power management in memory systems that contain multiple memory circuits.

BACKGROUND

The memory capacity requirements of various systems are increasing rapidly. However, other industry trends such as higher memory bus speeds and small form factor machines, etc. are reducing the number of memory module slots in such systems. Thus, a need exists in the industry for larger capacity memory circuits to be used in such systems.

However, there is also a limit to the power that may be dissipated per unit volume in the space available to the memory circuits. As a result, large capacity memory modules may be limited in terms of power that the memory modules may dissipate, and/or limited in terms of the ability of power supply systems to deliver sufficient power to such memory modules. There is thus a need for overcoming these limitations and/or other problems associated with the prior art.

SUMMARY

An apparatus and method are provided for communicating with a plurality of physical memory circuits. In use, at least one virtual memory circuit is simulated where at least one aspect (e.g. power-related aspect, etc.) of such virtual memory circuit(s) is different from at least one aspect of at least one of the physical memory circuits. Further, in various embodiments, such simulation may be carried out by a system (or component thereof), an interface circuit, etc.

DETAILED DESCRIPTION

Figure 1:
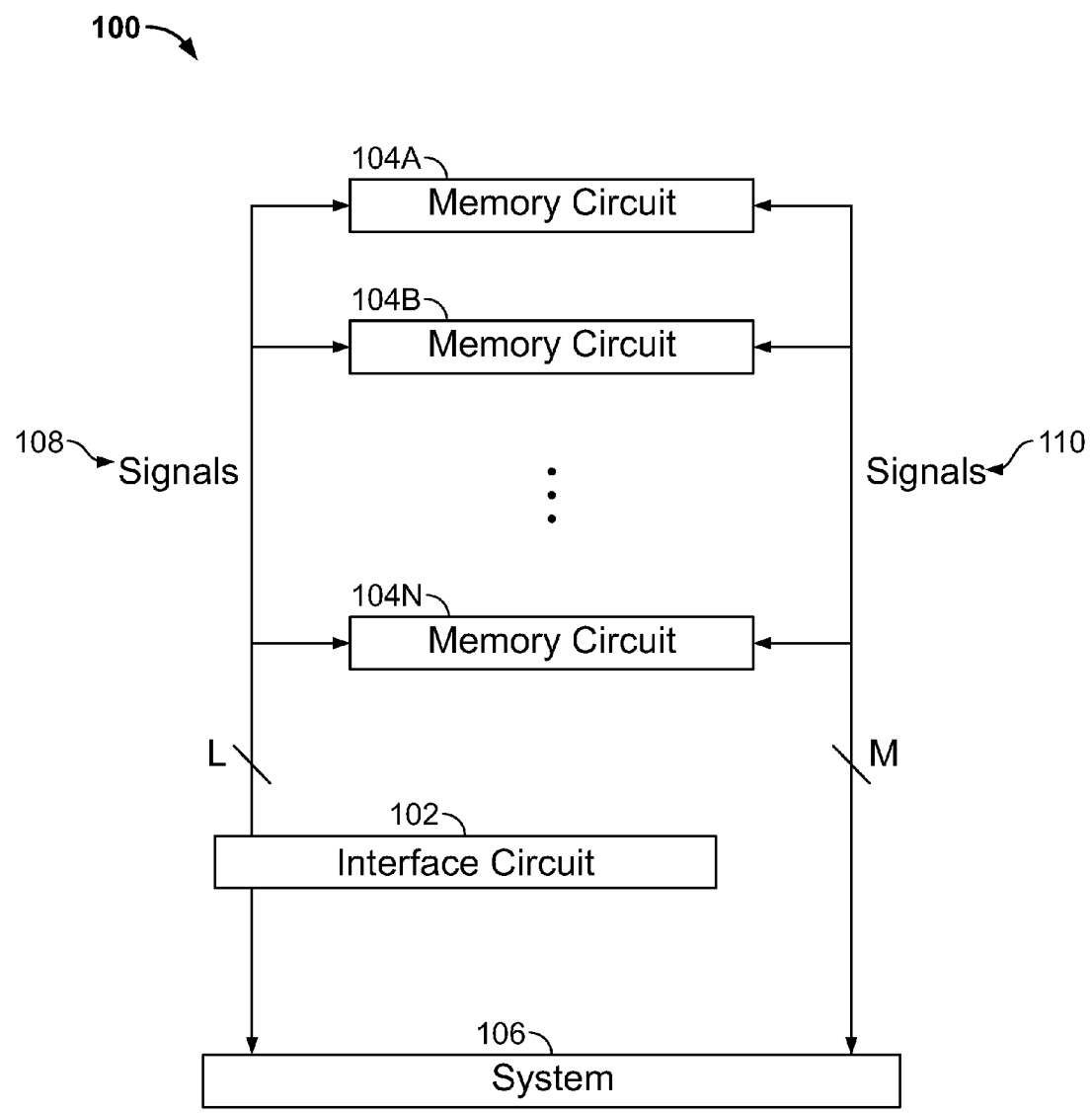
FIG. 1 illustrates a multiple memory circuit framework, in accordance with one embodiment.

FIG. 1 illustrates a multiple memory circuit framework 100, in accordance with one embodiment. As shown, included are an interface circuit 102, a plurality of memory circuits 104A, 104B, 104N, and a system 106. In the context of the present description, such memory circuits 104A, 104B, 104N may include any circuit capable of serving as memory.

For example, in various embodiments, at least one of the memory circuits 104A, 104B, 104N may include a monolithic memory circuit, a semiconductor die, a chip, a packaged memory circuit, or any other type of tangible memory circuit. In one embodiment, the memory circuits 104A, 104B, 104N may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (SDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 104A, 104B, 104N may include magnetic random access memory (MRAM), intelligent random access memory (IRAM), distributed network architecture (DNA) memory, window random access memory (WRAM), flash memory (e.g. NAND, NOR, etc.), pseudostatic random access memory (PSRAM), Low-Power Synchronous Dynamic Random Access Memory (LP-SDRAM), Polymer Ferroelectric RAM (PFRAM), OVONICS Unified Memory (OUM) or other chalcogenide memory, Phase-change Memory (PCM), Phase-change Random Access Memory (PRAM), Ferroelectric RAM (FeRAM), REsistance RAM (R-RAM or RRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly, as an option, the memory circuits 104A, 104B, 104N may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a MiniDIMM, a very low profile (VLP) R-DIMM, etc. In other embodiments, the memory circuits 104A, 104B, 104N may or may not be positioned on any type of material forming a substrate, card, module, sheet, fabric, board, carrier or other any other type of solid or flexible entity, form, or object. Of course, in other embodiments, the memory circuits 104A, 104B, 104N may or may not be positioned in or on any desired entity, form, or object for packaging purposes. Still yet, the memory circuits 104A, 104B, 104N may or may not be organized, either as a group (or as groups) collectively, or individually, onto one or more portions(s). In the context of the present description, the term portion(s) (e.g. of a memory circuit(s)) shall refer to any physical, logical or electrical arrangement(s), partition(s), subdivisions(s) (e.g. banks, sub-banks, ranks, sub-ranks, rows, columns, pages, etc.), or any other portion(s), for that matter.

Further, in the context of the present description, the system 106 may include any system capable of requesting and/or initiating a process that results in an access of the memory circuits 104A, 104B, 104N. As an option, the system 106 may accomplish this utilizing a memory controller (not shown), or any other desired mechanism. In one embodiment, such system 106 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 102 may, in the context of the present description, refer to any circuit capable of communicating (e.g. interfacing, buffering, etc.) with the memory circuits 104A, 104B, 104N and the system 106. For example, the interface circuit 102 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 104A, 104B, 104N and the system 106. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 102 may include one or more circuits, such as a buffer (e.g. buffer chip, multiplexer/de-multiplexer chip, synchronous multiplexer/de-multiplexer chip, etc.), register (e.g. register chip, data register chip, address/control register chip, etc.), advanced memory buffer (AMB) (e.g. AMB chip, etc.), a component positioned on at least one DIMM, etc.

In various embodiments and in the context of the present description, a buffer chip may be used to interface bidirectional data signals, and may or may not use a clock to re-time or re-synchronize signals in a well known manner. A bidirectional signal is a well known use of a single connection to transmit data in two directions. A data register chip may be a register chip that also interfaces bidirectional data signals. A multiplexer/de-multiplexer chip is a well known circuit that may interface a first number of bidirectional signals to a second number of bidirectional signals. A synchronous multiplexer/de-multiplexer chip may additionally use a clock to re-time or re-synchronize the first or second number of signals. In the context of the present description, a register chip may be used to interface and optionally re-time or re-synchronize address and control signals. The term address/control register chip may be used to distinguish a register chip that only interfaces address and control signals from a data register chip, which may also interface data signals.

Moreover, the register may, in various embodiments, include a JEDEC Solid State Technology Association (known as JEDEC) standard register (a JEDEC register), a register with forwarding, storing, and/or buffering capabilities, etc. In various embodiments, the registers, buffers, and/or any other interface circuit(s) 102 may be intelligent, that is, include logic that are capable of one or more functions such as gathering and/or storing information; inferring, predicting, and/or storing state and/or status; performing logical decisions; and/or performing operations on input signals, etc. In still other embodiments, the interface circuit 102 may optionally be manufactured in monolithic form, packaged form, printed form, and/or any other manufactured form of circuit, for that matter.

In still yet another embodiment, a plurality of the aforementioned interface circuits 102 may serve, in combination, to interface the memory circuits 104A, 104B, 104N and the system 106. Thus, in various embodiments, one, two, three, four, or more interface circuits 102 may be utilized for such interfacing purposes. In addition, multiple interface circuits 102 may be relatively configured or connected in any desired manner. For example, the interface circuits 102 may be configured or connected in parallel, serially, or in various combinations thereof. The multiple interface circuits 102 may use direct connections to each other, indirect connections to each other, or even a combination thereof. Furthermore, any number of the interface circuits 102 may be allocated to any number of the memory circuits 104A, 104B, 104N. In various other embodiments, each of the plurality of interface circuits 102 may be the same or different. Even still, the interface circuits 102 may share the same or similar interface tasks and/or perform different interface tasks.

While the memory circuits 104A, 104B, 104N, interface circuit 102, and system 106 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 102 (or portion(s) thereof) may be packaged with at least one of the memory circuits 104A, 104B, 104N. Thus, a DRAM stack may or may not include at least one interface circuit (or portion(s) thereof). In other embodiments, different numbers of the interface circuit 102 (or portions(s) thereof) may be packaged together. Such different packaging arrangements, when employed, may optionally improve the utilization of a monolithic silicon implementation, for example.

The interface circuit 102 may be capable of various functionality, in the context of different embodiments. For example, in one optional embodiment, the interface circuit 102 may interface a plurality of signals 108 that are connected between the memory circuits 104A, 104B, 104N and the system 106. The signals 108 may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections.

In one aspect of the present embodiment, the interfaced signals 108 may represent all of the signals that are connected between the memory circuits 104A, 104B, 104N and the system 106. In other aspects, at least a portion of signals 110 may use direct connections between the memory circuits 104A, 104B, 104N and the system 106. The signals 110 may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections. Moreover, the number of interfaced signals 108 (e.g. vs. a number of the signals that use direct connections 110, etc.) may vary such that the interfaced signals 108 may include at least a majority of the total number of signal connections between the memory circuits 104A, 104B, 104N and the systems 106 (e.g. L>M, with L and M as shown in FIG. 1). In other embodiments, L may be less than or equal to M. In still other embodiments L and/or M may be zero.

In yet another embodiment, the interface circuit 102 and/or any component of the system 106 may or may not be operable to communicate with the memory circuits 104A, 104B, 104N for simulating at least one memory circuit. The memory circuits 104A, 104B, 104N shall hereafter be referred to, where appropriate for clarification purposes, as the "physical" memory circuits or memory circuits, but are not limited to be so. Just by way of example, the physical memory circuits may include a single physical memory circuit. Further, the at least one simulated memory circuit shall hereafter be referred to, where appropriate for clarification purposes, as the at least one "virtual" memory circuit. In a similar fashion any property or aspect of such a physical memory circuit shall be referred to, where appropriate for clarification purposes, as a physical aspect (e.g. physical bank, physical portion, physical timing parameter, etc.). Further, any property or aspect of such a virtual memory circuit shall be referred to, where appropriate for clarification purposes, as a virtual aspect (e.g. virtual bank, virtual portion, virtual timing parameter, etc.).

In the context of the present description, the term simulate or simulation may refer to any simulating, emulating, transforming, disguising modifying, changing, altering, shaping, converting, etc., of at least one aspect of the memory circuits. In different embodiments, such aspect may include, for example, a number, a signal, a capacity, a portion (e.g. bank, partition, etc.), an organization (e.g. bank organization, etc.), a mapping (e.g. address mapping, etc.), a timing, a latency, a design parameter, a logical interface, a control system, a property, a behavior, and/or any other aspect, for that matter. Still yet, in various embodiments, any of the previous aspects or any other aspect, for that matter, may be power-related, meaning that such power-related aspect, at least in part, directly or indirectly affects power.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

In still additional exemplary embodiments, the aforementioned virtual aspect may be simulated (e.g. simulate a virtual aspect, the simulation of a virtual aspect, a simulated virtual aspect etc.). Further, in the context of the present description, the terms map, mapping, mapped, etc. refer to the link or connection from the physical aspects to the virtual aspects (e.g. map a physical aspect to a virtual aspect, mapping a physical aspect to a virtual aspect, a physical aspect mapped to a virtual aspect etc.). It should be noted that any use of such mapping or anything equivalent thereto is deemed to fall within the scope of the previously defined simulate or simulation term.

More illustrative information will now be set forth regarding optional functionality/architecture of different embodiments which may or may not be implemented in the context of FIG. 1, per the desires of the user. It should be strongly noted that the following information is set forth for illustrative purposes and should not be construed as limiting in any manner. For example, any of the following features may be optionally incorporated with or without the other features described.

Figure 2:
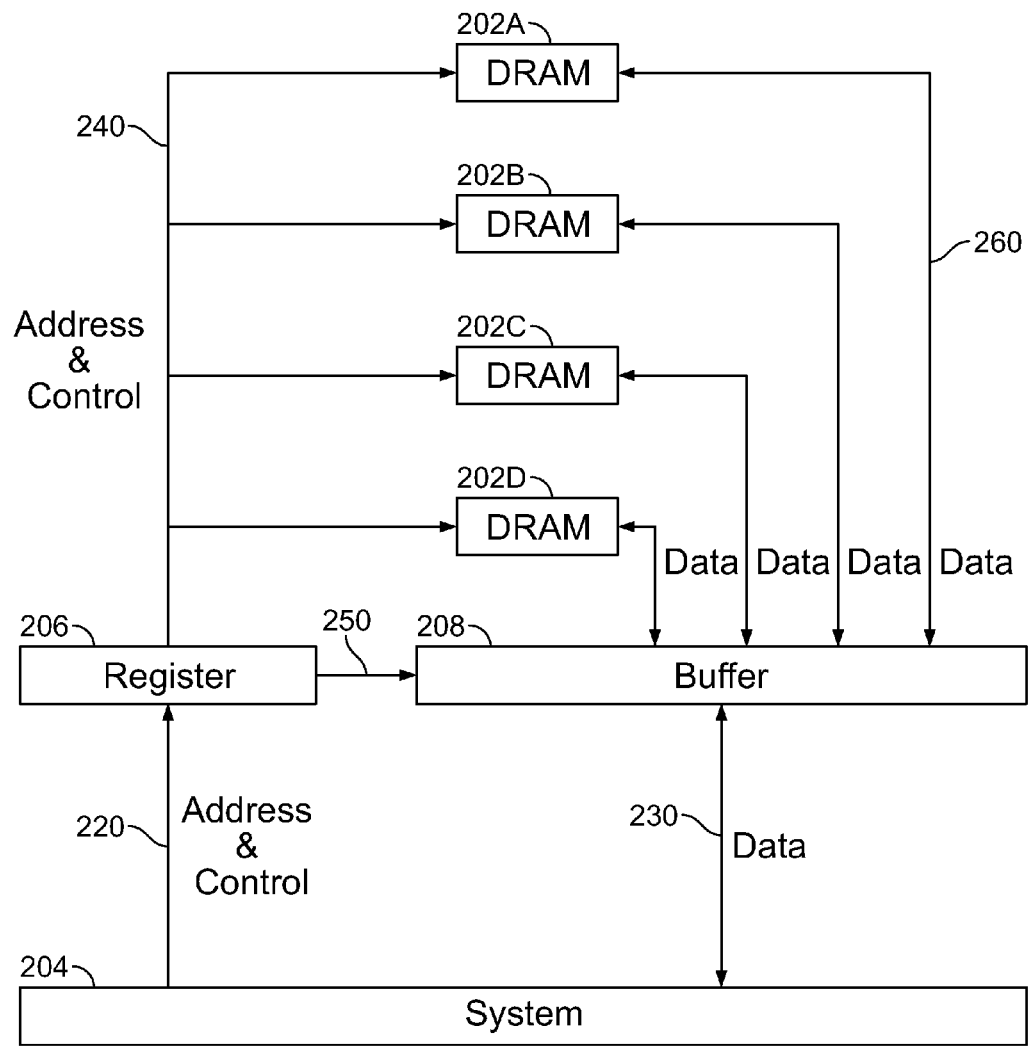
FIG. 2 shows an exemplary embodiment of an interface circuit including a register and a buffer that is operable to interface memory circuits and a system.

FIG. 2 shows an exemplary embodiment of an interface circuit that is operable to interface memory circuits 202A-D and a system 204. In this embodiment, the interface circuit includes a register 206 and a buffer 208. Address and control signals 220 from the system 204 are connected to the register 206, while data signals 230 from the system 204 are connected to the buffer 208. The register 206 drives address and control signals 240 to the memory circuits 202A-D and optionally drives address and control signals 250 to the buffer 208. Data signals 260 of the memory circuits 202A-D are connected to the buffer 208.

Figure 3:
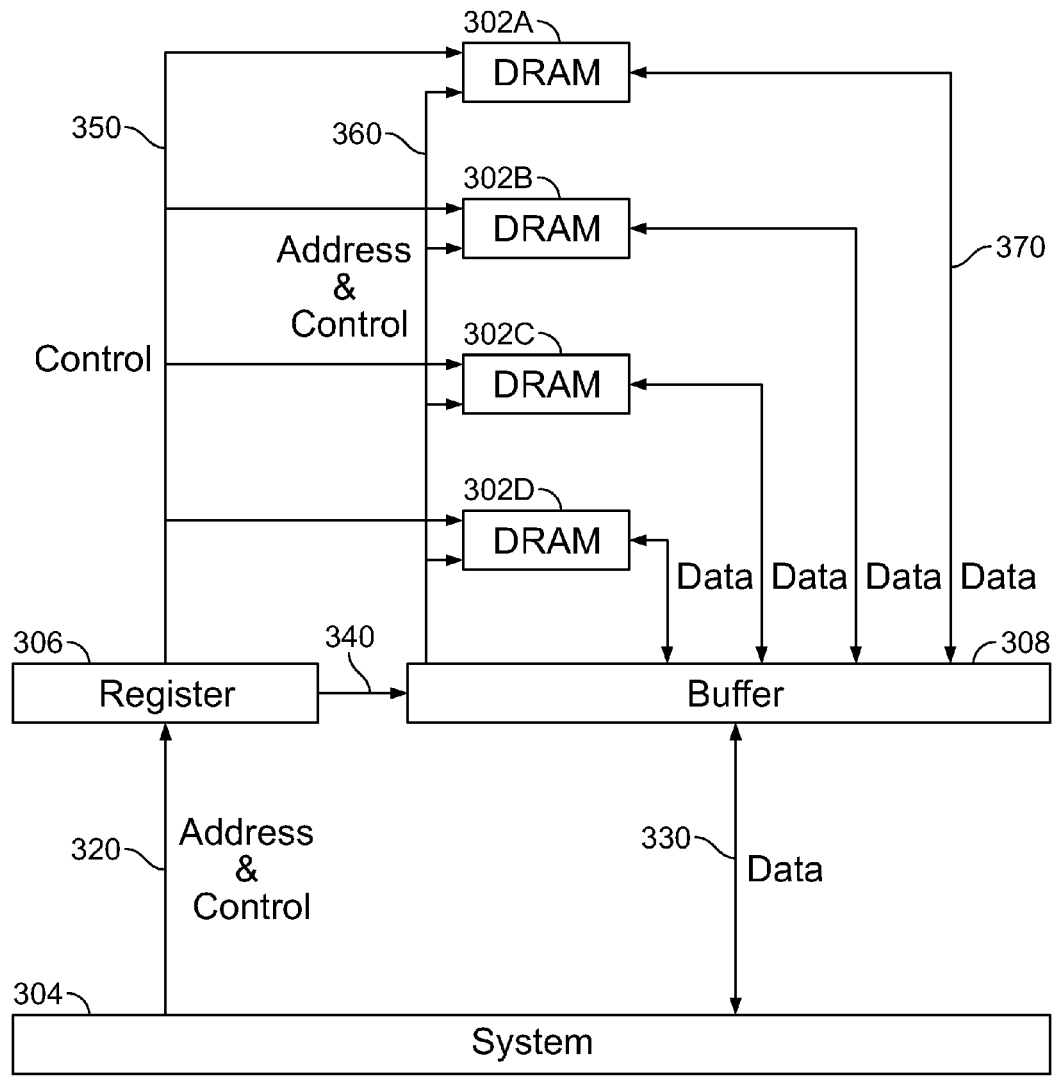
FIG. 3 shows an alternative exemplary embodiment of an interface circuit including a register and a buffer that is operable to interface memory circuits and a system.

FIG. 3 shows an exemplary embodiment of an interface circuit that is operable to interface memory circuits 302A-D and a system 304. In this embodiment, the interface circuit includes a register 306 and a buffer 308. Address and control signals 320 from the system 304 are connected to the register 306, while data signals 330 from the system 304 are connected to the buffer 308. The register 306 drives address and control signals 340 to the buffer 308, and optionally drives control signals 350 to the memory circuits 302A-D. The buffer 308 drives address and control signals 360. Data signals 370 of the memory circuits 304A-D are connected to the buffer 308.

Figure 4:
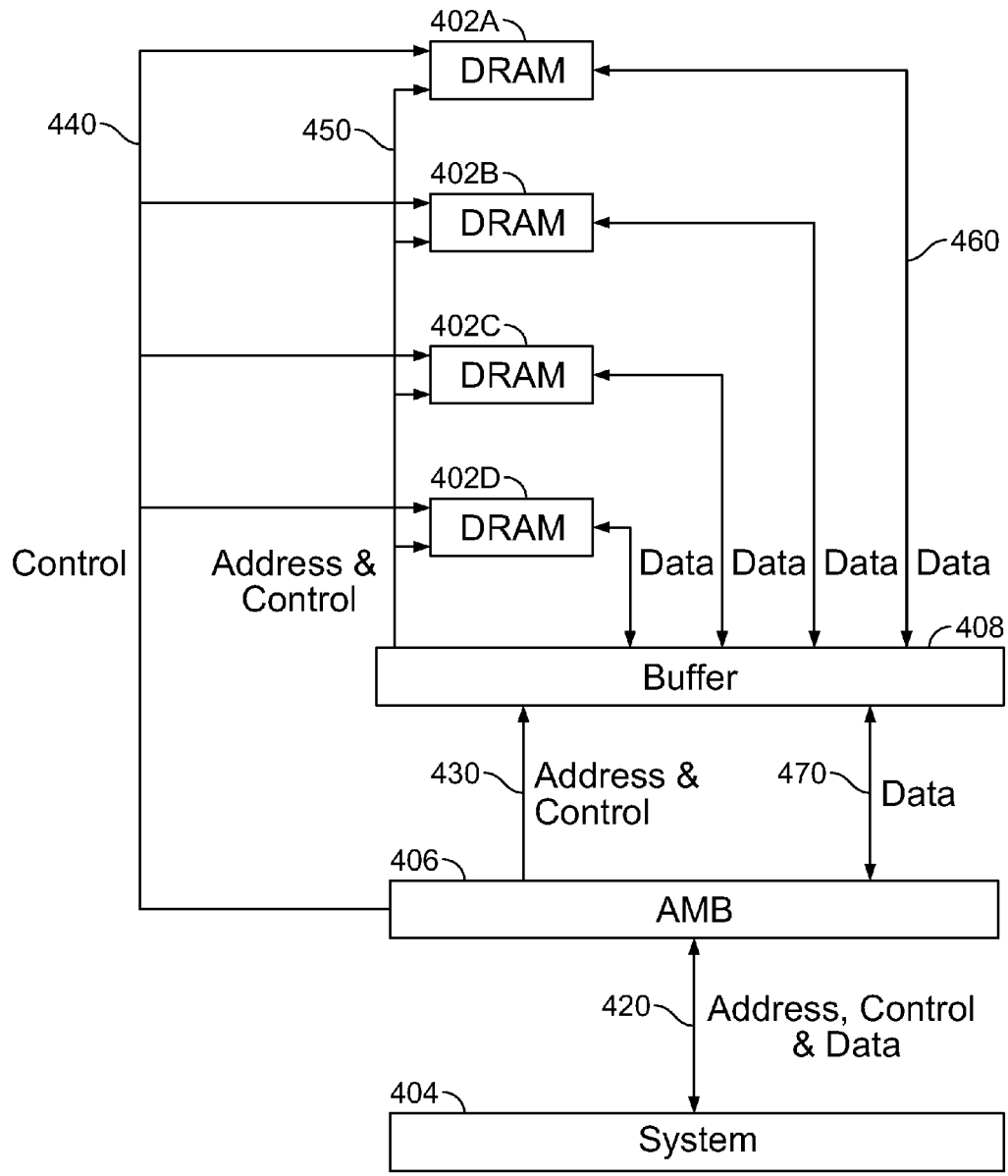
FIG. 4 shows an exemplary embodiment of an interface circuit including an advanced memory buffer (AMB) and a buffer that is operable to interface memory circuits and a system.

FIG. 4 shows an exemplary embodiment of an interface circuit that is operable to interface memory circuits 402A-D and a system 404. In this embodiment, the interface circuit includes an advanced memory buffer (AMB) 406 and a buffer 408. Address, control, and data signals 420 from the system 404 are connected to the AMB 406. The AMB 406 drives address and control signals 430 to the buffer 408 and optionally drives control signals 440 to the memory circuits 402A-D. The buffer 408 drives address and control signals 450. Data signals 460 of the memory circuits 402A-D are connected to the buffer 408. Data signals 470 of the buffer 408 are connected to the AMB 406.

Figure 5:
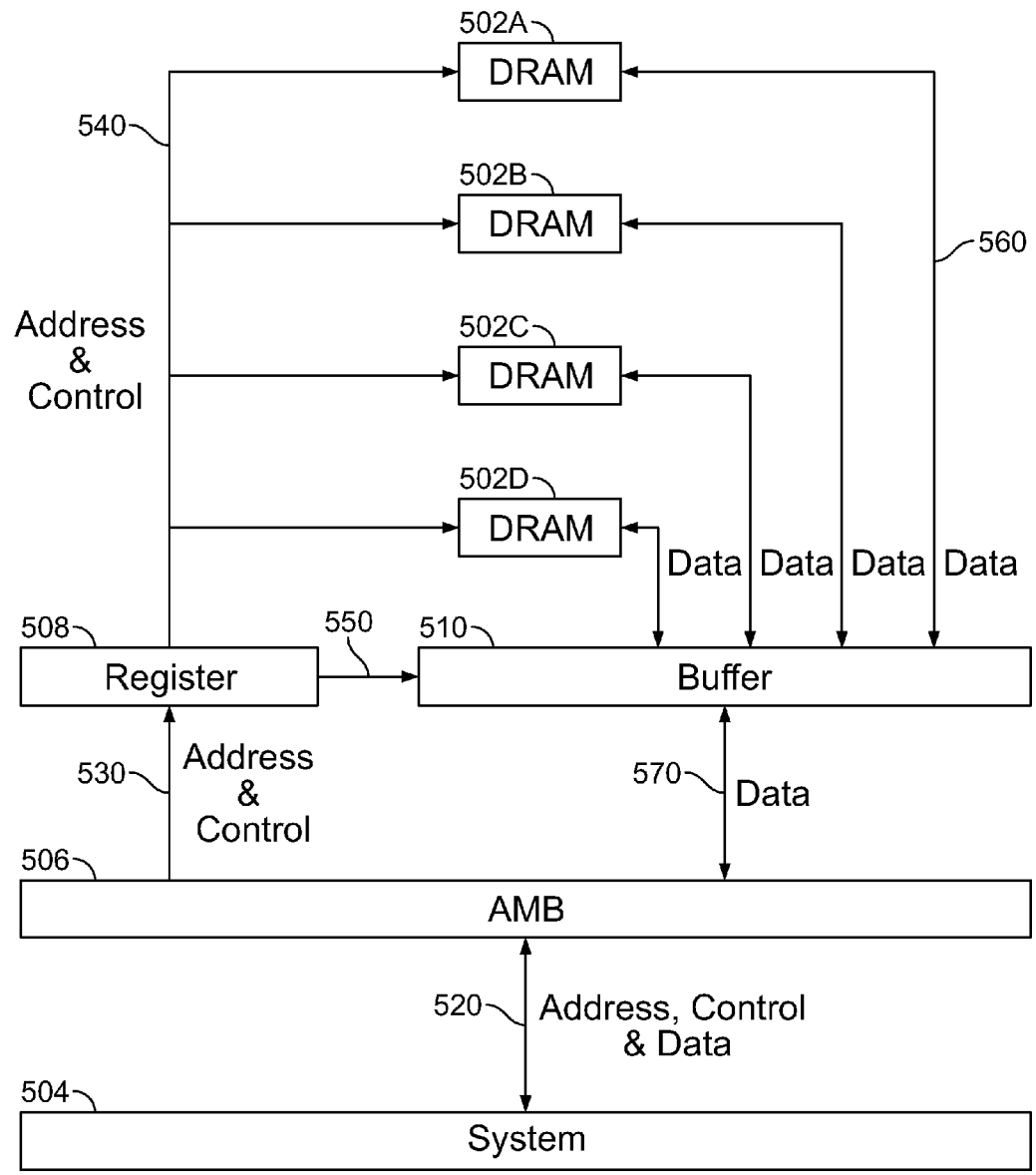
FIG. 5 shows an exemplary embodiment of an interface circuit including an AMB, a register, and a buffer that is operable to interface memory circuits and a system.

FIG. 5 shows an exemplary embodiment of an interface circuit that is operable to interface memory circuits 502A-D and a system 504. In this embodiment, the interface circuit includes an AMB 506, a register 508, and a buffer 510. Address, control, and data signals 520 from the system 504 are connected to the AMB 506. The AMB 506 drives address and control signals 530 to the register 508. The register, in turn, drives address and control signals 540 to the memory circuits 502A-D. It also optionally drives control signals 550 to the buffer 510. Data signals 560 from the memory circuits 502A-D are connected to the buffer 510. Data signals 570 of the buffer 510 are connected to the AMB 506.

Figure 6:
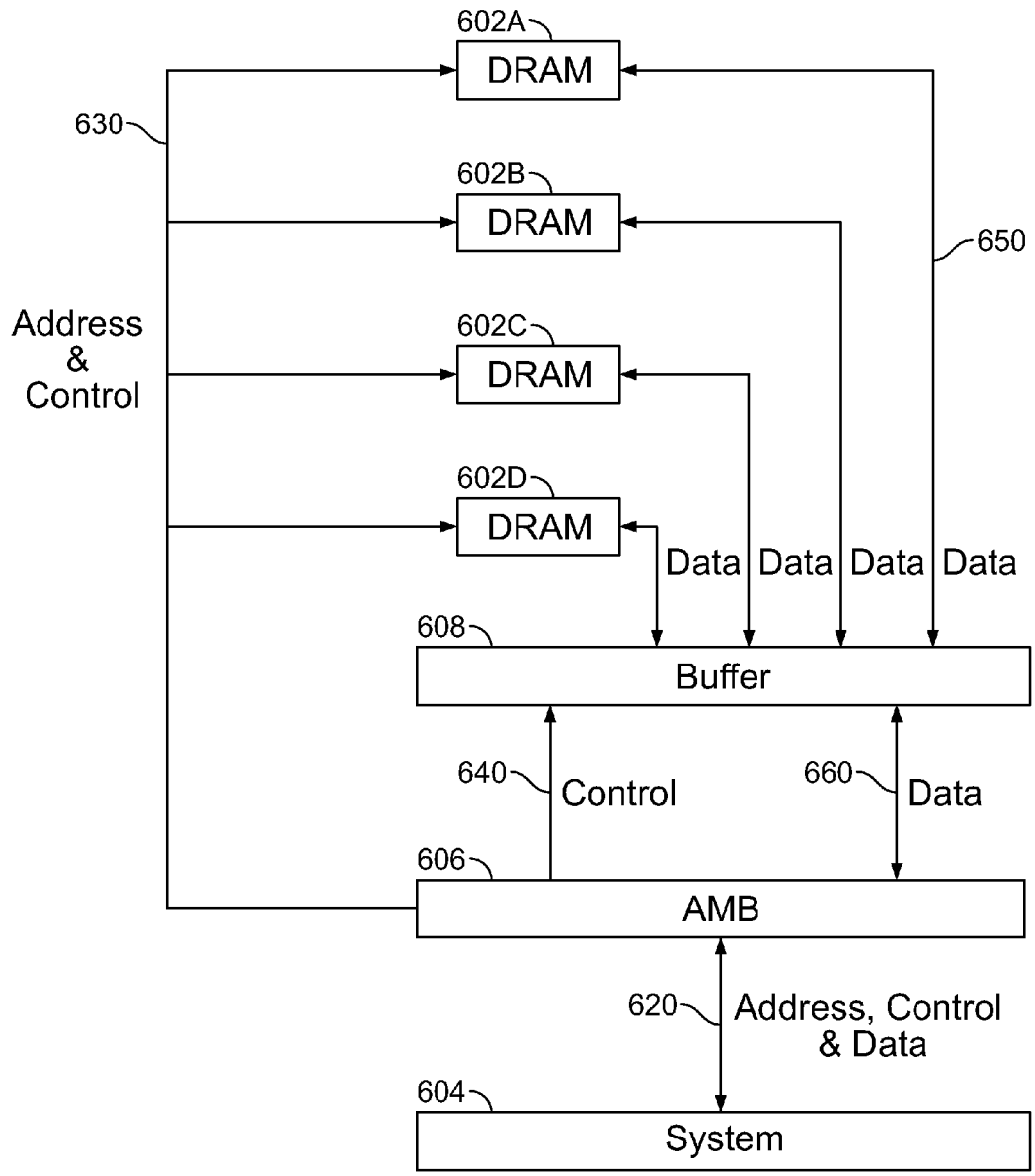
FIG. 6 shows an alternative exemplary embodiment of an interface circuit including an AMB and a buffer that is operable to interface memory circuits and a system.

FIG. 6 shows an exemplary embodiment of an interface circuit that is operable to interface memory circuits 602A-D and a system 604. In this embodiment, the interface circuit includes an AMB 606 and a buffer 608. Address, control, and data signals 620 from the system 604 are connected to the AMB 606. The AMB 606 drives address and control signals 630 to the memory circuits 602A-D as well as control signals 640 to the buffer 608. Data signals 650 from the memory circuits 602A-D are connected to the buffer 608. Data signals 660 are connected between the buffer 608 and the AMB 606.

In other embodiments, combinations of the above implementations shown in FIGS. 2-6 may be utilized. Just by way of example, one or more registers (register chip, address/control register chip, data register chip, JEDEC register, etc.) may be utilized in conjunction with one or more buffers (e.g. buffer chip, multiplexer/de-multiplexer chip, synchronous multiplexer/de-multiplexer chip and/or other intelligent interface circuits) with one or more AMBs (e.g. AMB chip, etc.). In other embodiments, these register(s), buffer(s), AMB(s) may be utilized alone and/or integrated in groups and/or integrated with or without the memory circuits.

The electrical connections between the buffer(s), the register(s), the AMB(s) and the memory circuits may be configured in any desired manner. In one optional embodiment, address, control (e.g. command, etc.), and clock signals may be common to all memory circuits (e.g. using one common bus). As another option, there may be multiple address, control and clock busses. As yet another option, there may be individual address, control and clock busses to each memory circuit. Similarly, data signals may be wired as one common bus, several busses or as an individual bus to each memory circuit. Of course, it should be noted that any combinations of such configurations may also be utilized. For example, the memory circuits may have one common address, control and clock bus with individual data busses. In another example, memory circuits may have one, two (or more) address, control and clock busses along with one, two (or more) data busses. In still yet another example, the memory circuits may have one address, control and clock bus together with two data busses (e.g. the number of address, control, clock and data busses may be different, etc.). In addition, the memory circuits may have one common address, control and clock bus and one common data bus. It should be noted that any other permutations and combinations of such address, control, clock and data buses may be utilized.

These configurations may therefore allow for the host system to only be in contact with a load of the buffer(s), or register(s), or AMB(s) on the memory bus. In this way, any electrical loading problems (e.g. bad signal integrity, improper signal timing, etc.) associated with the memory circuits may (but not necessarily) be prevented, in the context of various optional embodiments.

Furthermore, there may be any number of memory circuits. Just by way of example, the interface circuit(s) may be connected to 1, 2, 4, 8 or more memory circuits. In alternate embodiments, to permit data integrity storage or for other reasons, the interface circuit(s) may be connected to an odd number of memory circuits. Additionally, the memory circuits may be arranged in a single stack. Of course, however, the memory circuits may also be arranged in a plurality of stacks or in any other fashion.

In various embodiments where DRAM circuits are employed, such DRAM (e.g. DDR2 SDRAM) circuits may be composed of a plurality of portions (e.g. ranks, sub-ranks, banks, sub-banks, etc.) that may be capable of performing operations (e.g. precharge, active, read, write, refresh, etc.) in parallel (e.g. simultaneously, concurrently, overlapping, etc.). The JEDEC standards and specifications describe how DRAM (e.g. DDR2 SDRAM) circuits are composed and perform operations in response to commands. Purely as an example, a 512 Mb DDR2 SDRAM circuit that meets JEDEC specifications may be composed of four portions (e.g. banks, etc.) (each of which has 128 Mb of capacity) that are capable of performing operations in parallel in response to commands. As another example, a 2 Gb DDR2 SDRAM circuit that is compliant with JEDEC specifications may be composed of eight banks (each of which has 256 Mb of capacity). A portion (e.g. bank, etc.) of the DRAM circuit is said to be in the active state after an activate command is issued to that portion. A portion (e.g. bank, etc.) of the DRAM circuit is said to be in the precharge state after a precharge command is issued to that portion. When at least one portion (e.g. bank, etc.) of the DRAM circuit is in the active state, the entire DRAM circuit is said to be in the active state. When all portions (e.g. banks, etc.) of the DRAM circuit are in precharge state, the entire DRAM circuit is said to be in the precharge state. A relative time period spent by the entire DRAM circuit in precharge state with respect to the time period spent by the entire DRAM circuit in active state during normal operation may be defined as the precharge-to-active ratio.

DRAM circuits may also support a plurality of power management modes. Some of these modes may represent power saving modes. As an example, DDR2 SDRAMs may support four power saving modes. In particular, two active power down modes, precharge power down mode, and self-refresh mode may be supported, in one embodiment. A DRAM circuit may enter an active power down mode if the DRAM circuit is in the active state when it receives a power down command. A DRAM circuit may enter the precharge power down mode if the DRAM circuit is in the precharge state when it receives a power down command. A higher precharge-to-active ratio may increase the likelihood that a DRAM circuit may enter the precharge power down mode rather than an active power down mode when the DRAM circuit is the target of a power saving operation. In some types of DRAM circuits, the precharge power down mode and the self refresh mode may provide greater power savings that the active power down modes.

In one embodiment, the system may be operable to perform a power management operation on at least one of the memory circuits, and optionally on the interface circuit, based on the state of the at least one memory circuit. Such a power management operation may include, among others, a power saving operation. In the context of the present description, the term power saving operation may refer to any operation that results in at least some power savings.

In one such embodiment, the power saving operation may include applying a power saving command to one or more memory circuits, and optionally to the interface circuit, based on at least one state of one or more memory circuits. Such power saving command may include, for example, initiating a power down operation applied to one or more memory circuits, and optionally to the interface circuit. Further, such state may depend on identification of the current, past or predictable future status of one or more memory circuits, a predetermined combination of commands to the one or more memory circuits, a predetermined pattern of commands to the one or more memory circuits, a predetermined absence of commands to the one or more memory circuits, any command(s) to the one or more memory circuits, and/or any command(s) to one or more memory circuits other than the one or more memory circuits. Such commands may have occurred in the past, might be occurring in the present, or may be predicted to occur in the future. Future commands may be predicted since the system (e.g. memory controller, etc.) may be aware of future accesses to the memory circuits in advance of the execution of the commands by the memory circuits. In the context of the present description, such current, past, or predictable future status may refer to any property of the memory circuit that may be monitored, stored, and/or predicted.

For example, the system may identify at least one of a plurality of memory circuits that may not be accessed for some period of time. Such status identification may involve determining whether a portion(s) (e.g. bank(s), etc.) is being accessed in at least one of the plurality of memory circuits. Of course, any other technique may be used that results in the identification of at least one of the memory circuits (or portion(s) thereof) that is not being accessed (e.g. in a non-accessed state, etc.). In other embodiments, other such states may be detected or identified and used for power management.

In response to the identification of a memory circuit that is in a non-accessed state, a power saving operation may be initiated in association with the memory circuit (or portion(s) thereof) that is in the non-accessed state. In one optional embodiment, such power saving operation may involve a power down operation (e.g. entry into an active power down mode, entry into a precharge power down mode, etc.). As an option, such power saving operation may be initiated utilizing (e.g. in response to, etc.) a power management signal including, but not limited to a clock enable (CKE) signal, chip select (CS) signal, row address strobe (RAS), column address strobe (CAS), write enable (WE), and optionally in combination with other signals and/or commands. In other embodiments, use of a non-power management signal (e.g. control signal(s), address signal(s), data signal(s), command(s), etc.) is similarly contemplated for initiating the power saving operation. Of course, however, it should be noted that anything that results in modification of the power behavior may be employed in the context of the present embodiment.

Since precharge power down mode may provide greater power savings than active power down mode, the system may, in yet another embodiment, be operable to map the physical memory circuits to appear as at least one virtual memory circuit with at least one aspect that is different from that of the physical memory circuits, resulting in a first behavior of the virtual memory circuits that is different from a second behavior of the physical memory circuits. As an option, the interface circuit may be operable to aid or participate in the mapping of the physical memory circuits such that they appear as at least one virtual memory circuit.

During use, and in accordance with one optional embodiment, the physical memory circuits may be mapped to appear as at least one virtual memory circuit with at least one aspect that is different from that of the physical memory circuits, resulting in a first behavior of the at least one virtual memory circuits that is different from a second behavior of one or more of the physical memory circuits. Such behavior may, in one embodiment, include power behavior (e.g. a power consumption, current consumption, current waveform, any other aspect of power management or behavior, etc.). Such power behavior simulation may effect or result in a reduction or other modification of average power consumption, reduction or other modification of peak power consumption or other measure of power consumption, reduction or other modification of peak current consumption or other measure of current consumption, and/or modification of other power behavior (e.g. parameters, metrics, etc.).

In one exemplary embodiment, the at least one aspect that is altered by the simulation may be the precharge-to-active ratio of the physical memory circuits. In various embodiments, the alteration of such a ratio may be fixed (e.g. constant, etc.) or may be variable (e.g. dynamic, etc.).

In one embodiment, a fixed alteration of this ratio may be accomplished by a simulation that results in physical memory circuits appearing to have fewer portions (e.g. banks, etc.) that may be capable of performing operations in parallel. Purely as an example, a physical 1 Gb DDR2 SDRAM circuit with eight physical banks may be mapped to a virtual 1 Gb DDR2 SDRAM circuit with two virtual banks, by coalescing or combining four physical banks into one virtual bank. Such a simulation may increase the precharge-to-active ratio of the virtual memory circuit since the virtual memory circuit now has fewer portions (e.g. banks, etc.) that may be in use (e.g. in an active state, etc.) at any given time. Thus, there is higher likelihood that a power saving operation targeted at such a virtual memory circuit may result in that particular virtual memory circuit entering precharge power down mode as opposed to entering an active power down mode. Again as an example, a physical 1 Gb DDR2 SDRAM circuit with eight physical banks may have a probability, g, that all eight physical banks are in the precharge state at any given time. However, when the same physical 1 Gb DDR2 SDRAM circuit is mapped to a virtual 1 Gb DDR2 SDRAM circuit with two virtual banks, the virtual DDR2 SDRAM circuit may have a probability, h, that both the virtual banks are in the precharge state at any given time. Under normal operating conditions of the system, h may be greater than g. Thus, a power saving operation directed at the aforementioned virtual 1 Gb DDR2 SDRAM circuit may have a higher likelihood of placing the DDR2 SDRAM circuit in a precharge power down mode as compared to a similar power saving operation directed at the aforementioned physical 1 Gb DDR2 SDRAM circuit.

A virtual memory circuit with fewer portions (e.g. banks, etc.) than a physical memory circuit with equivalent capacity may not be compatible with certain industry standards (e.g. JEDEC standards). For example, the JEDEC Standard No. JESD 21-C for DDR2 SDRAM specifies a 1 Gb DRAM circuit with eight banks. Thus, a 1 Gb virtual DRAM circuit with two virtual banks may not be compliant with the JEDEC standard. So, in another embodiment, a plurality of physical memory circuits, each having a first number of physical portions (e.g. banks, etc.), may be mapped to at least one virtual memory circuit such that the at least one virtual memory circuit complies with an industry standard, and such that each physical memory circuit that is part of the at least one virtual memory circuit has a second number of portions (e.g. banks, etc.) that may be capable of performing operations in parallel, wherein the second number of portions is different from the first number of portions. As an example, four physical 1 Gb DDR2 SDRAM circuits (each with eight physical banks) may be mapped to a single virtual 4 Gb DDR2 SDRAM circuit with eight virtual banks, wherein the eight physical banks in each physical 1 Gb DDR2 SDRAM circuit have been coalesced or combined into two virtual banks. As another example, four physical 1 Gb DDR2 SDRAM circuits (each with eight physical banks) may be mapped to two virtual 2 Gb DDR2 SDRAM circuits, each with eight virtual banks, wherein the eight physical banks in each physical 1 Gb DDR2 SDRAM circuit have been coalesced or combined into four virtual banks. Strictly as an option, the interface circuit may be operable to aid the system in the mapping of the physical memory circuits.

Figure 7:
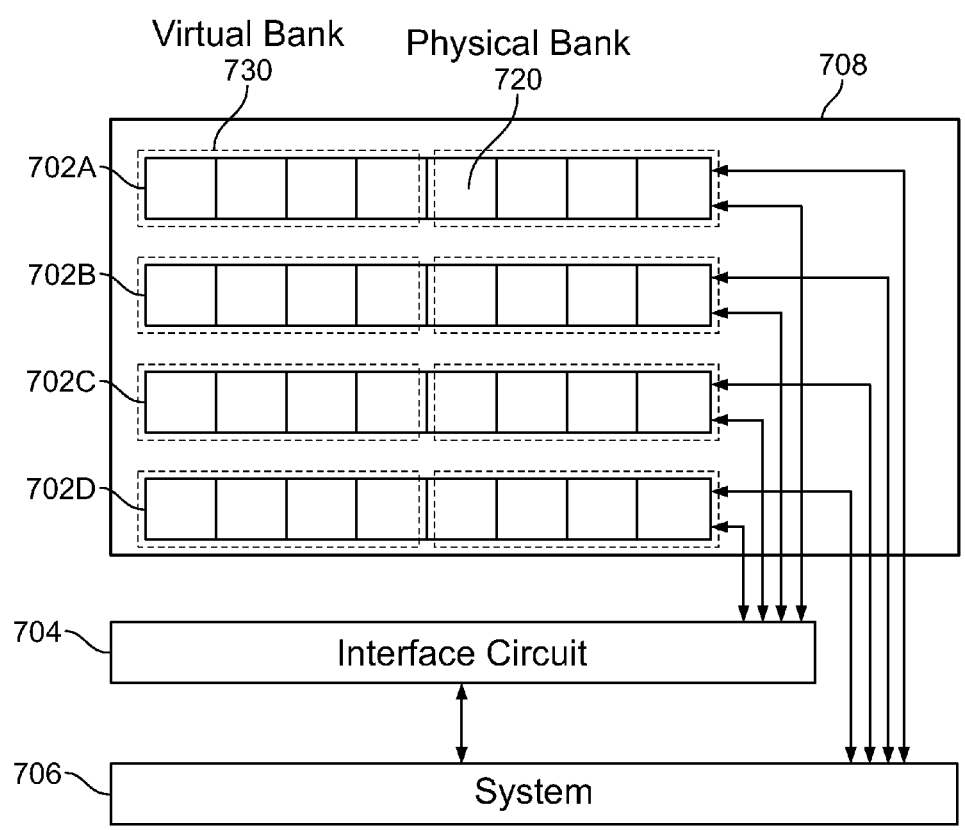
FIG. 7 shows an exemplary embodiment of a plurality of physical memory circuits that are mapped by a system, and optionally an interface circuit, to appear as a virtual memory circuit with one aspect that is different from that of the physical memory circuits.

FIG. 7 shows an example of four physical 1 Gb DDR2 SDRAM circuits 702A-D that are mapped by the system 706, and optionally with the aid or participation of interface circuit 704, to appear as a virtual 4 Gb DDR2 SDRAM circuit 708. Each physical DRAM circuit 702A-D containing eight physical banks 720 has been mapped to two virtual banks 730 of the virtual 4 Gb DDR2 SDRAM circuit 708.

In this example, the simulation or mapping results in the memory circuits having fewer portions (e.g. banks etc.) that may be capable of performing operations in parallel. For example, this simulation may be done by mapping (e.g. coalescing or combining) a first number of physical portion(s) (e.g. banks, etc.) into a second number of virtual portion(s). If the second number is less than the first number, a memory circuit may have fewer portions that may be in use at any given time. Thus, there may be a higher likelihood that a power saving operation targeted at such a memory circuit may result in that particular memory circuit consuming less power.

In another embodiment, a variable change in the precharge-to-active ratio may be accomplished by a simulation that results in the at least one virtual memory circuit having at least one latency that is different from that of the physical memory circuits. As an example, a physical 1 Gb DDR2 SDRAM circuit with eight banks may be mapped by the system, and optionally the interface circuit, to appear as a virtual 1 Gb DDR2 SDRAM circuit with eight virtual banks having at least one latency that is different from that of the physical DRAM circuits. The latency may include one or more timing parameters such as tFAW, tRRD, tRP, tRCD, tRFC(MIN), etc.

In the context of various embodiments, tFAW is the 4-Bank activate period; tRRD is the ACTIVE bank a to ACTIVE bank b command timing parameter; tRP is the PRECHARGE command period; tRCD is the ACTIVE-to-READ or WRITE delay; and tRFC(min) is the minimum value of the REFRESH to ACTIVE or REFRESH to REFRESH command interval.

In the context of one specific exemplary embodiment, these and other DRAM timing parameters are defined in the JEDEC specifications (for example JESD 21-C for DDR2 SDRAM and updates, corrections and errata available at the JEDEC website) as well as the DRAM manufacturer datasheets (for example the MICRON datasheet for 1 Gb: .times.4, .times.8, .times.16 DDR2 SDRAM, example part number MT47H256M4, labeled PDF: 09005aef821ae8bf/ Source: 09005aef821aed36, 1 GbDDR2TOC.fm-Rev. K 9/06 EN, and available at the MICRON website).

To further illustrate, the virtual DRAM circuit may be simulated to have a tRP(virtual) that is greater than the tRP (physical) of the physical DRAM circuit. Such a simulation may thus increase the minimum latency between a precharge command and a subsequent activate command to a portion (e.g. bank, etc.) of the virtual DRAM circuit. As another example, the virtual DRAM circuit may be simulated to have a tRRD(virtual) that is greater than the tRRD(physical) of the physical DRAM circuit. Such a simulation may thus increase the minimum latency between successive activate commands to various portions (e.g. banks, etc.) of the virtual DRAM circuit. Such simulations may increase the precharge-to-active ratio of the memory circuit. Therefore, there is higher likelihood that a memory circuit may enter precharge power down mode rather than an active power down mode when it is the target of a power saving operation. The system may optionally change the values of one or more latencies of the at least one virtual memory circuit in response to present, past, or future commands to the memory circuits, the temperature of the memory circuits, etc. That is, the at least one aspect of the virtual memory circuit may be changed dynamically.

Some memory buses (e.g. DDR, DDR2, etc.) may allow the use of 1T or 2T address timing (also known as 1T or 2T address clocking). The MICRON technical note TN-47-01, DDR2 DESIGN GUIDE FOR TWO-DIMM SYSTEMS (available at the MICRON website) explains the meaning and use of 1T and 2T address timing as follows: "Further, the address bus can be clocked using 1T or 2T clocking. With 1T, a new command can be issued on every clock cycle 2T timing will hold the address and command bus valid for two clock cycles. This reduces the efficiency of the bus to one command per two clocks, but it doubles the amount of setup and hold time. The data bus remains the same for all of the variations in the address bus."

In an alternate embodiment, the system may change the precharge-to-active ratio of the virtual memory circuit by changing from 1T address timing to 2T address timing when sending addresses and control signals to the interface circuit and/or the memory circuits. Since 2T address timing affects the latency between successive commands to the memory circuits, the precharge-to-active ratio of a memory circuit may be changed. Strictly as an option, the system may dynamically change between 1T and 2T address timing.

In one embodiment, the system may communicate a first number of power management signals to the interface circuit to control the power behavior. The interface circuit may communicate a second number of power management signals to at least a portion of the memory circuits. In various embodiments, the second number of power management signals may be the same of different from the first number of power management signals. In still another embodiment, the second number of power management signals may be utilized to perform power management of the portion(s) of the virtual or physical memory circuits in a manner that is independent from each other and/or independent from the first number of power management signals received from the system (which may or may not also be utilized in a manner that is independent from each other). In alternate embodiments, the system may provide power management signals directly to the memory circuits. In the context of the present description, such power management signal(s) may refer to any control signal (e.g. one or more address signals; one or more data signals; a combination of one or more control signals; a sequence of one or more control signals; a signal associated with an active (or active) operation, precharge operation, write operation, read operation, a mode register write operation, a mode register read operation, a refresh operation, or other encoded or direct operation, command or control signal, etc.). The operation associated with a command may consist of the command itself and optionally, one or more necessary signals and/or behavior.

In one embodiment, the power management signals received from the system may be individual signals supplied to a DIMM. The power management signals may include, for example, CKE and CS signals. These power management signals may also be used in conjunction and/or combination with each other, and optionally, with other signals and commands that are encoded using other signals (e.g. RAS, CAS, WE, address etc.) for example. The JEDEC standards may be describe how commands directed to memory circuits are to be encoded. As the number of memory circuits on a DIMM is increased, it is beneficial to increase the number of power management signals so as to increase the flexibility of the system to manage portion(s) of the memory circuits on a DIMM. In order to increase the number of power management signals from the system without increasing space and the difficulty of the motherboard routing, the power management signals may take several forms. In some of these forms, the power management signals may be encoded, located, placed, or multiplexed in various existing fields (e.g. data field, address field, etc.), signals (e.g. CKE signal, CD signal, etc.), and/or busses.

For example a signal may be a single wire; that is a single electrical point-to-point connection. In this case, the signal is un-encoded and not bussed, multiplexed, or encoded. As another example, a command directed to a memory circuit may be encoded, for example, in an address signal, by setting a predefined number of bits in a predefined location (or field) on the address bus to a specific combination that uniquely identifies that command. In this case the command is said to be encoded on the address bus and located or placed in a certain position, location, or field. In another example, multiple bits of information may be placed on multiple wires that form a bus. In yet another example, a signal that requires the transfer of two or more bits of information may be time-multiplexed onto a single wire. For example, the time-multiplexed sequence of 10 (a one followed by a zero) may be made equivalent to two individual signals: a one and a zero. Such examples of time-multiplexing are another form of encoding. Such various well-known methods of signaling, encoding (or lack thereof), bussing, and multiplexing, etc. may be used in isolation or combination.

Thus, in one embodiment, the power management signals from the system may occupy currently unused connection pins on a DIMM (unused pins may be specified by the JEDEC standards). In another embodiment, the power management signals may use existing CKE and CS pins on a DIMM, according to the JEDEC standard, along with additional CKE and CD pins to enable, for example, power management of DIMM capacities that may not yet be currently defined by the JEDEC standards.

In another embodiment the power management signals from the system may be encoded in the CKE and CS signals. Thus, for example, the CKE signal may be a bus, and the power management signals may be encoded on that bus. In one example, a 3-bit wide bus comprising three signals on three separate wires: CKE[0], CKE[1], and CKE[2], may be decoded by the interface circuit to produce eight separate CKE signals that comprise the power management signals for the memory circuits.

In yet another embodiment, the power management signals from the system may be encoded in unused portions of existing fields. Thus, for example, certain commands may have portions of the fields set to X (also known as don't care). In this case, the setting of such bit(s) to either a one or to a zero does not affect the command. The effectively unused bit position in this field may thus be used to carry a power management signal. The power management signal may thus be encoded and located or placed in a field in a bus, for example.

Further, the power management schemes described for the DRAM circuits may also be extended to the interface circuits. For example, the system may have or may infer information that a signal, bus, or other connection will not be used for a period of time. During this period of time, the system may perform power management on the interface circuit or part(s) thereof. Such power management may, for example, use an intelligent signaling mechanism (e.g. encoded signals, sideband signals, etc.) between the system and interface circuits (e.g. register chips, buffer chips, AMB chips, etc.), and/or between interface circuits. These signals may be used to power manage (e.g. power off circuits, turn off or reduce bias currents, switch off or gate clocks, reduce voltage or current, etc) part(s) of the interface circuits (e.g. input receiver circuits, internal logic circuits, clock generation circuits, output driver circuits, termination circuits, etc.)

It should thus be clear that the power management schemes described here are by way of specific examples for a particular technology, but that the methods and techniques are very general and may be applied to any memory circuit technology and any system (e.g. memory controller, etc.) to achieve control over power behavior including, for example, the realization of power consumption savings and management of current consumption behavior.

Figure 8:
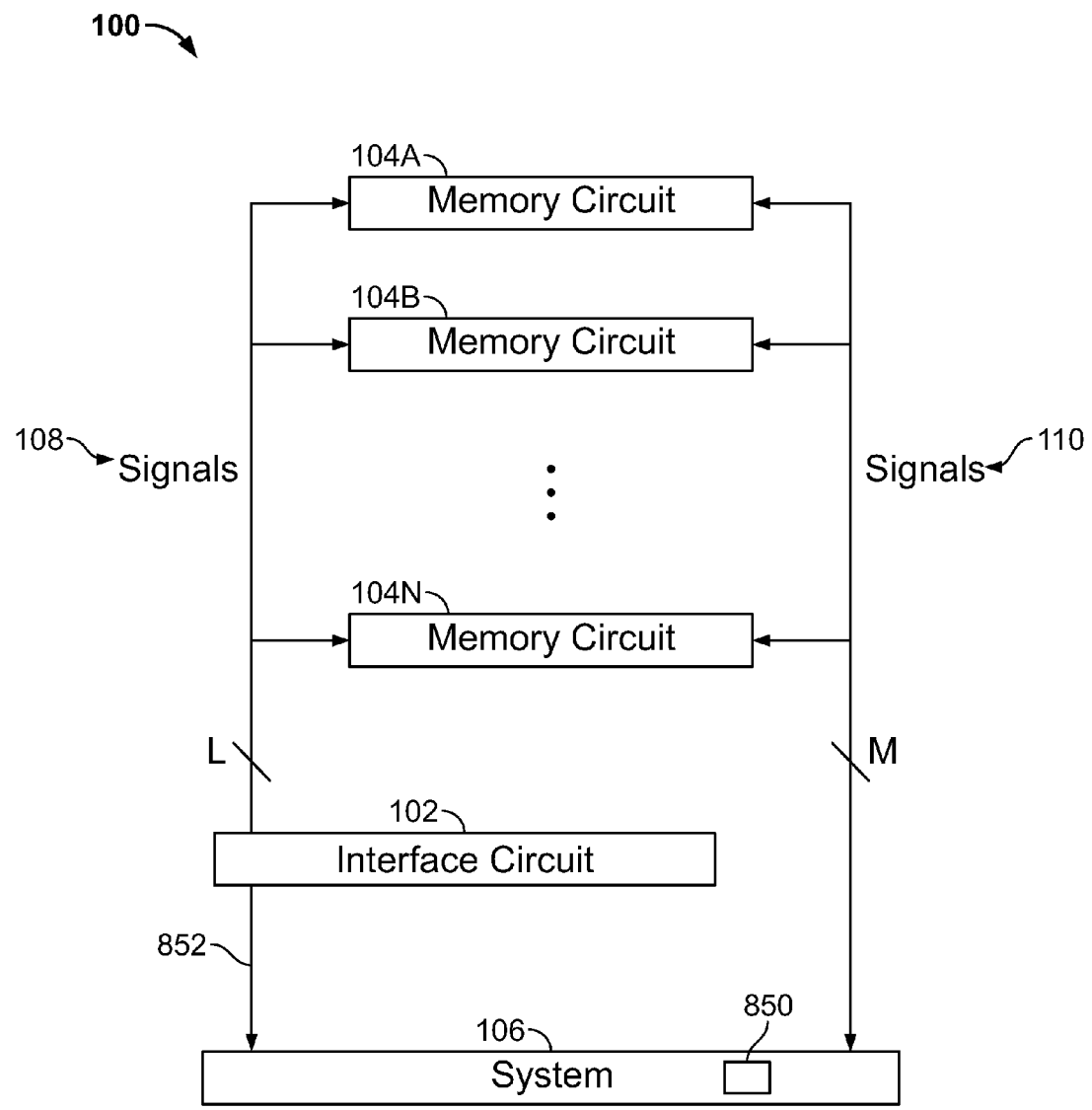
FIG. 8 illustrates an embodiment of a multiple memory circuit framework.

FIG. 8 illustrates an embodiment of a multiple memory circuit framework that is similar to the multiple memory framework in FIG. 1. FIG. 8, however, shows a memory controller 850 within the system 106. The interface circuit 102 is configured to communicate with the memory controller 850 via bus 852.

Figure 9:
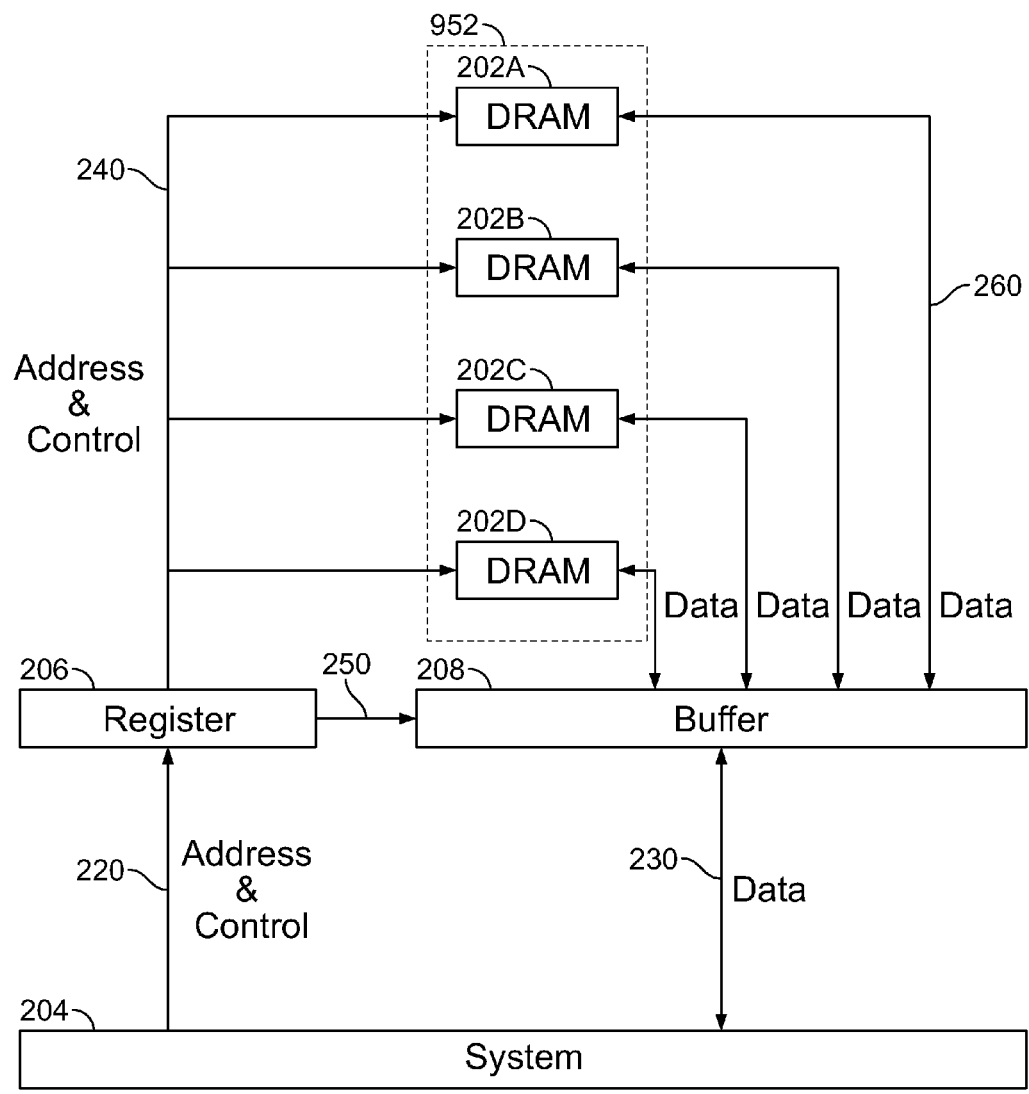
FIG. 9 shows an exemplary embodiment of an interface circuit that is operable to interface memory circuits and a system.

FIG. 9 shows an exemplary embodiment of an interface circuit that is operable to interface memory circuits 202A-D and a system 204 similar to the exemplary embodiment in FIG. 2. In FIG. 9, however, the plurality of memory circuits 202A-D is a plurality of dynamic random access memory (DRAM) circuits in a dual in-line memory module (DIMM) 952.

Figure 10:
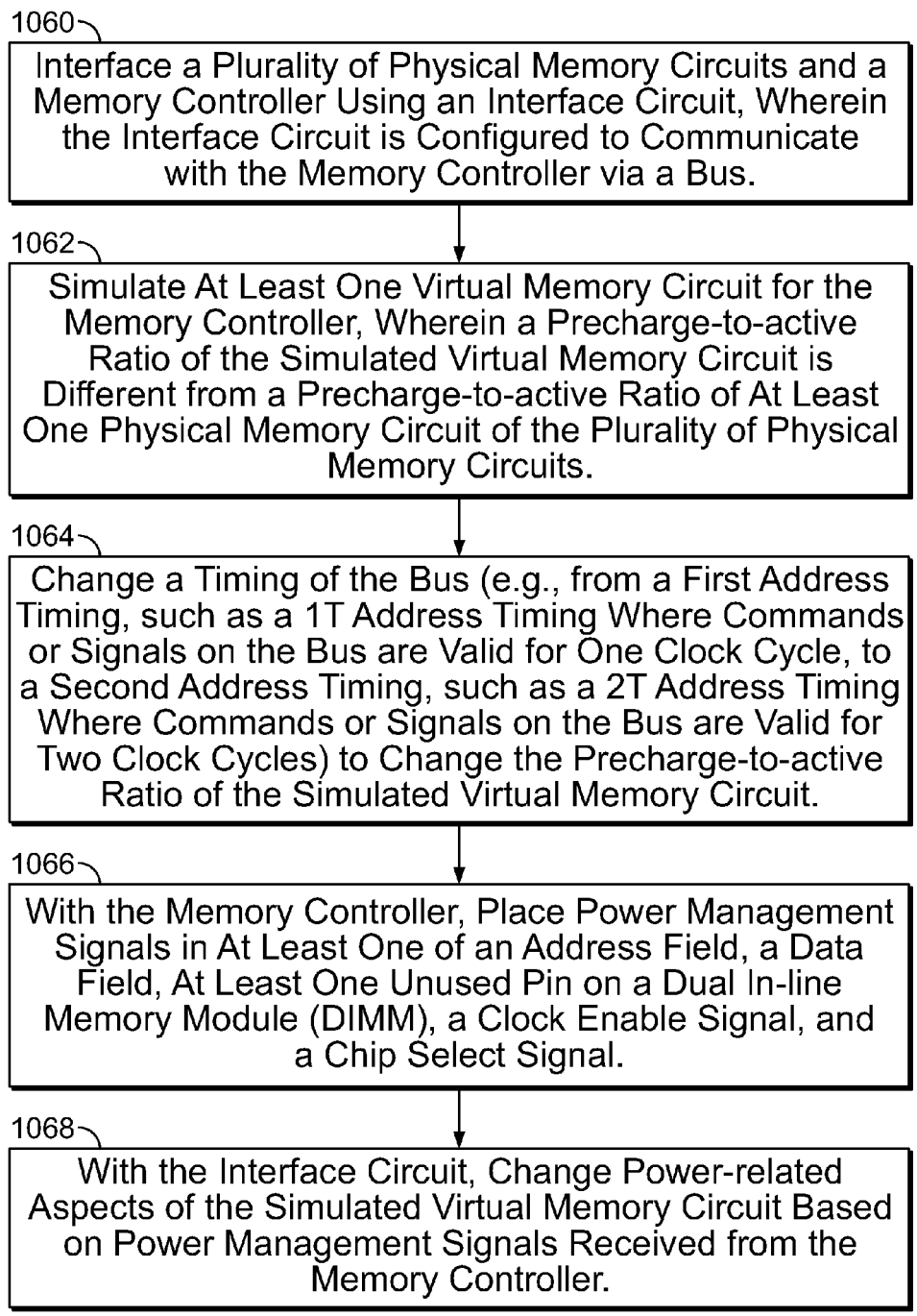
FIG. 10 is a flowchart showing an embodiment of a method for simulating at least one virtual memory circuit.

FIG. 10 is a flowchart showing an embodiment of a method for simulating at least one virtual memory circuit.

The method includes interfacing (at 1060) a plurality of physical memory circuits and a memory controller using an interface circuit, wherein the interface circuit is configured to communicate with the memory controller via a bus.

The method also includes simulating (at 1062) at least one virtual memory circuit for the memory controller, wherein a precharge-to-active ratio of the simulated virtual memory circuit is different from a precharge-to-active ratio of at least one physical memory circuit of the plurality of physical memory circuits.

The method also includes changing (at 1064) in a timing of the bus to change the precharge-to-active ratio of the simulated virtual memory circuit. In some implementations, the change in the timing of the bus is a change from a first address timing to a second address timing. The first address timing can be a 1T address timing and the second address timing is a 2T address timing. Typically, commands or signals on the bus are valid for one clock cycle when the 1T address timing is used, whereas commands or signals on the bus are valid for two clock cycles when the 2T address timing is used.

The method also includes placing (at 1066), with the memory controller, power management signals in at least one of an address field, a data field, at least one unused pin on a dual in-line memory module (DIMM), a clock enable signal, and a chip select signal.

The method also includes changing (at 1068), with the interface circuit, power-related aspects of the simulated virtual memory circuit based on power management signals received from the memory controller.

The sequence of steps in FIG. 10 should not be interpreted as limiting in any way.

Figure 11:
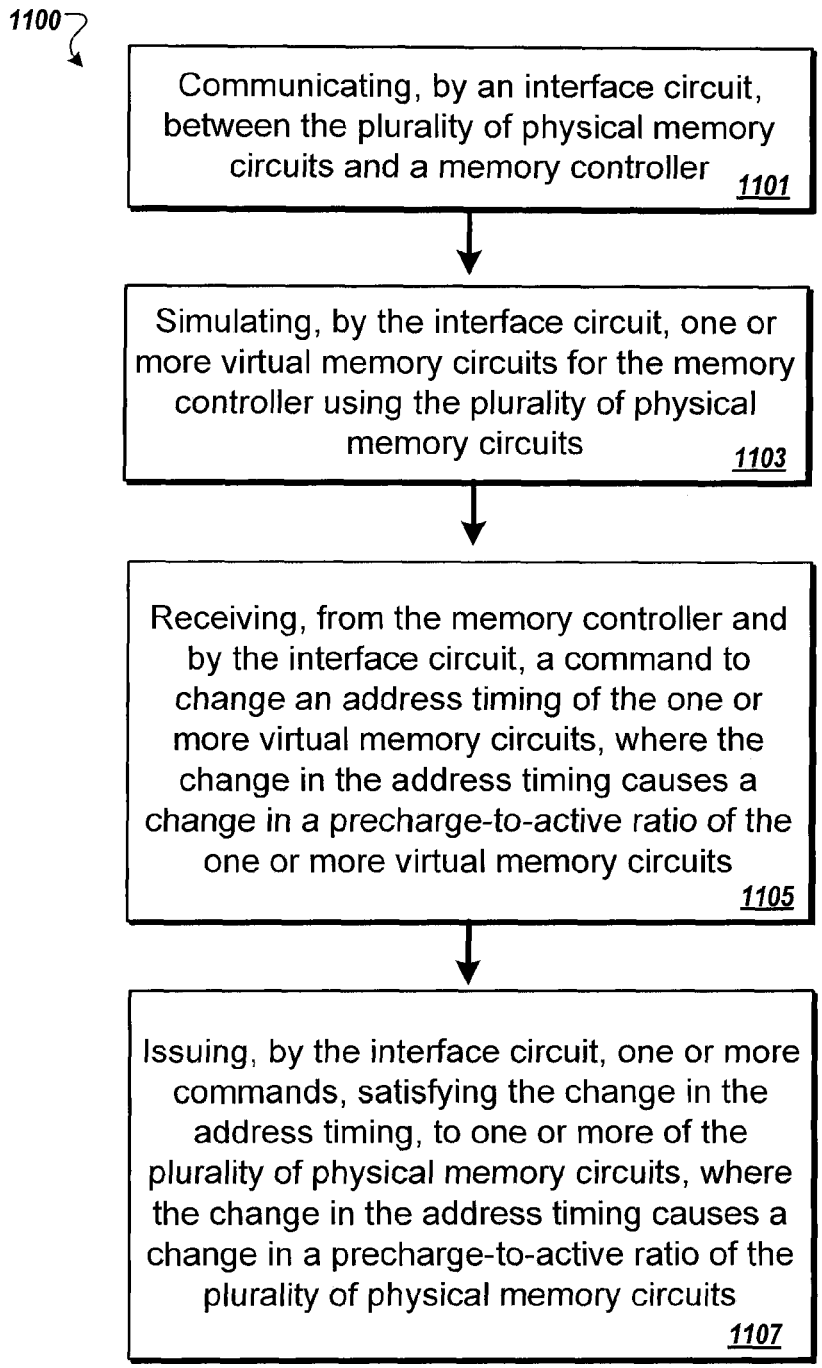
FIG. 11 is a flow chart illustrating an example method.

FIG. 11 is a flow chart illustrating an example method 1100. The method 1100 includes: communicating, by an interface circuit, between the plurality of physical memory circuits and a memory controller (1101); simulating, by the interface circuit, one or more virtual memory circuits for the memory controller using the plurality of physical memory circuits (1103); receiving, from the memory controller and by the interface circuit, a command to change an address timing of the one or more virtual memory circuits, where the change in the address timing causes a change in a precharge-to-active ratio of the one or more virtual memory circuits (1105); and issuing, by the interface circuit, one or more commands, satisfying the change in the address timing, to one or more of the plurality of physical memory circuits, where the change in the address timing causes a change in a precharge-to-active ratio of the plurality of physical memory circuits (1107).

While various embodiments have been described above, it should be understood that they have been presented by way of example only, and not limitation. For example, any of the elements may employ any of the desired functionality set forth hereinabove. Hence, as an option, a plurality of memory circuits may be mapped using simulation to appear as at least one virtual memory circuit, wherein a first number of portions (e.g. banks, etc.) in each physical memory circuit may be coalesced or combined into a second number of virtual portions (e.g. banks, etc.), and the at least one virtual memory circuit may have at least one latency that is different from the corresponding latency of the physical memory circuits. Of course, in various embodiments, the first and second number of portions may include any one or more portions. Thus, the breadth and scope of a preferred embodiment should not be limited by any of the above-described exemplary embodiments, but should be defined only in accordance with the following claims and their equivalents.

What is claimed is:

1. An apparatus comprising:
a plurality of physical memory circuits; and
an interface circuit configured to:
communicate between the plurality of physical memory circuits and a memory controller;
simulate one or more virtual memory circuits for the memory controller using the plurality of physical memory circuits;
receive, from the memory controller, a command to change an address timing of the one or more virtual memory circuits from a first address timing to a second address timing, wherein the change in the address timing causes a change in a precharge-to-active ratio of the one or more virtual memory circuits; and
issue one or more commands, satisfying the change in the address timing, to one or more of the plurality of physical memory circuits, wherein the change in the address timing causes a change in a precharge-to-active ratio of the plurality of physical memory circuits.

2. The apparatus of claim 1, wherein the first address timing includes a 1T address timing and the second address timing includes a 2T address timing, and wherein the interface circuit is configured to change the address timing of the one or more virtual memory circuits from the 1T address timing to the 2T address timing to increase the precharge-to-active ratio of the one or more virtual memory circuits.

3. The apparatus of claim 1, wherein the address timing of the one or more virtual memory circuits includes a minimum clock cycle timing between a first command and a subsequent command received by the interface circuit, and wherein a change in the minimum clock cycle timing changes the precharge-to-active ratio of the one or more virtual memory circuits.

4. The apparatus of claim 1, wherein the interface circuit is configured to determine the change in the address timing associated with the one or more virtual memory circuits so as to increases a likelihood of at least one of the physical memory circuits entering a precharge mode to increase the precharge-to-active ratio of the one or more virtual memory circuits.

5. The apparatus of claim 1, wherein the interface circuit is configured to receive a command to dynamically change from the first address timing to the second address timing associated with the one or more virtual memory circuits.

6. The apparatus of claim 5, wherein the address timing of the one or more virtual memory circuits is dynamically changed based on at least one of a past command, a present command, or an anticipated command from the memory controller to the one or more virtual memory circuits.

7. A method comprising:
communicating, by an interface circuit, between a plurality of physical memory circuits and a memory controller;
simulating, by the interface circuit, one or more virtual memory circuits for the memory controller using the plurality of physical memory circuits;
receiving, from the memory controller, a command to change an address timing of the one or more virtual memory circuits from a first address timing to a second address timing, wherein the change in the address timing causes a change in a precharge-to-active ratio of the one or more virtual memory circuits; and
issuing, by the interface circuit, one or more commands, satisfying the change in the address timing, to one or more of the plurality of physical memory circuits, wherein the change in the address timing causes a change in a precharge-to-active ratio of the plurality of physical memory circuits.

8. The method of claim 7, wherein the first address timing includes a 1T address timing and the second address timing includes a 2T address timing, and wherein a change from the 1T address timing to the 2T address timing increases the precharge-to-active ratio of the one or more virtual memory circuits.

9. The method of claim 7, wherein the address timing of the one or more virtual memory circuits includes a minimum clock cycle timing between a first command and a subsequent command received by the interface circuit, and wherein a change in the minimum clock cycle timing changes the precharge-to-active ratio of the one or more virtual memory circuits.

10. The method of claim 7, comprising:
receiving a command to dynamically change from the first address timing to the second address timing associated with the one or more virtual memory circuits.

11. An apparatus comprising:
a memory controller; and
a memory module comprising:
a plurality of physical memory circuits; and
an interface circuit configured to:
communicate between the plurality of physical memory circuits and the memory controller;
simulate one or more virtual memory circuits for the memory controller using the plurality of physical memory circuits;
receive, from the memory controller, a command to change an address timing of the one or more virtual memory circuits from a first address timing to a second address timing, wherein the change in the address timing causes a change in a precharge-to-active ratio of the one or more virtual memory circuits; and
issue one or more commands, satisfying the change in the address timing, to one or more of the plurality of physical memory circuits, wherein the change in the address timing causes a change in a precharge-to-active ratio of the plurality of physical memory circuits.

12. The apparatus of claim 11, wherein the first address timing includes a 1T address timing and the second address timing includes a 2T address timing, and wherein the interface circuit is configured to change the address timing of the one or more virtual memory circuits from the 1T address timing to the 2T address timing to increase the precharge-to-active ratio of the one or more virtual memory circuits.

13. The apparatus of claim 11, wherein the address timing of the one or more virtual memory circuits includes a minimum clock cycle timing between a first command and a subsequent command received by the interface circuit, and wherein a change in the minimum clock cycle timing changes the precharge-to-active ratio of the one or more virtual memory circuits.

14. The apparatus of claim 11, wherein the interface circuit is configured to receive a command to dynamically change from the first address timing to the second address timing associated with the one or more virtual memory circuits.

* * * * *